(12) United States Patent
Mitamura et al.

(10) Patent No.: US 10,125,294 B2
(45) Date of Patent: Nov. 13, 2018

(54) ADHESIVE SHEET, LAMINATE FOR TOUCH PANEL, AND CAPACITANCE-TYPE TOUCH PANEL

(71) Applicant: FUJIFILM Corporation, Minato-ku, Tokyo (JP)

(72) Inventors: Yasuhiro Mitamura, Ashigara-kami-gun (JP); Michihiro Shibata, Ashigara-kami-gun (JP); Shinya Ogikubo, Ashigara-kami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 252 days.

(21) Appl. No.: 14/851,217

(22) Filed: Sep. 11, 2015

(65) Prior Publication Data
US 2016/0002506 A1    Jan. 7, 2016

Related U.S. Application Data

(63) Continuation of application No. PCT/JP2014/056117, filed on Mar. 10, 2014.

(30) Foreign Application Priority Data

Mar. 13, 2013  (JP) ................. 2013-051051
Jul. 29, 2013   (JP) ................. 2013-156991

(51) Int. Cl.
*C09J 133/14*       (2006.01)
*C09J 109/00*       (2006.01)
(Continued)

(52) U.S. Cl.
CPC ............. *C09J 133/14* (2013.01); *C09D 4/06* (2013.01); *C09J 7/00* (2013.01); *C09J 109/00* (2013.01);
(Continued)

(58) Field of Classification Search
CPC ....................................................... G06F 3/00
See application file for complete search history.

(56) References Cited

U.S. PATENT DOCUMENTS

2010/0179864 A1*  7/2010  Feldman .......... G06Q 30/02
                                            705/12
2010/0215955 A1*  8/2010  Kishioka .......... B32B 7/12
                                            428/355 AC
(Continued)

FOREIGN PATENT DOCUMENTS

JP    2001-003031 A    1/2001
JP    2012-046658 A    3/2012
(Continued)

OTHER PUBLICATIONS

Communication dated Jun. 28, 2016 from the State Intellectual Property Office of the P.R.C. in counterpart Application No. 201480013231.4.
(Continued)

*Primary Examiner* — Gerard Higgins
*Assistant Examiner* — Sathavaram I Reddy
(74) *Attorney, Agent, or Firm* — Sughrue Mion, PLLC

(57) ABSTRACT

In an adhesive sheet, temperature dependence of a relative dielectric constant that is determined by a test for evaluating temperature dependence is equal to or less than 30%, and a 180° peel strength determined by a test for evaluating adhesiveness is equal to or greater than 0.20 N/mm. The adhesive sheet can inhibit the occurrence of malfunctioning of a capacitance-type touch panel in an environment of a wide temperature range from a low temperature to a high temperature, and can be included in a laminate for a touch panel and a capacitance-type touch panel.

12 Claims, 5 Drawing Sheets

(51) Int. Cl.
   *G06F 3/044* (2006.01)
   *H03K 17/96* (2006.01)
   *G06F 3/047* (2006.01)
   *C09J 7/00* (2018.01)
   *C09J 133/08* (2006.01)
   *C09D 4/06* (2006.01)

(52) U.S. Cl.
   CPC ............ *C09J 133/08* (2013.01); *G06F 3/044* (2013.01); *G06F 3/047* (2013.01); *H03K 17/962* (2013.01); *C09J 2201/622* (2013.01); *C09J 2203/318* (2013.01); *G06F 2203/04103* (2013.01); *G06F 2203/04112* (2013.01)

(56) References Cited

U.S. PATENT DOCUMENTS

| | | | |
|---|---|---|---|
| 2011/0226415 A1 | 9/2011 | Husemann et al. | |
| 2012/0157611 A1 | 6/2012 | Katami et al. | |
| 2012/0208013 A1* | 8/2012 | Clapper | C08G 81/021 428/355 AC |
| 2013/0021543 A1* | 1/2013 | Lin | G03F 7/027 349/12 |
| 2015/0050432 A1 | 2/2015 | Ooga et al. | |
| 2015/0079379 A1 | 3/2015 | Suzuki et al. | |

FOREIGN PATENT DOCUMENTS

| | | |
|---|---|---|
| JP | 2012-512267 A | 5/2012 |
| JP | 2012-140605 A | 7/2012 |
| JP | 2013-023690 A | 2/2013 |
| JP | 2013-144749 A | 7/2013 |
| TW | 201030114 A1 | 8/2010 |
| TW | 201305728 A1 | 2/2013 |
| WO | 2010/027041 A1 | 3/2010 |
| WO | 2012/043664 A1 | 4/2012 |
| WO | 2013/146015 A1 | 10/2013 |
| WO | 2013/187508 A1 | 12/2013 |

OTHER PUBLICATIONS

Communication dated Feb. 22, 2017 from the State Intellectual Property Office of the P.R.C. in corresponding Application No. 201480013231.4.
International Search Report for PCT/JP2014/056117 dated Jun. 10, 2014 [PCT/ISA/210], 8 pages.
Japanese Office Action, Notification of Reasons for Refusal for 2013-156991 dated Dec. 17, 2013, 4 pages.
Japanese Office Action, Notification of Reasons for Refusal for 2013-156991 dated Apr. 22, 2014, 4 pages.
Japanese Office Action, Notification of Reasons for Refusal for 2013-156991 dated Oct. 21, 2014, 4 pages.
International Preliminary Report on Patentability and Written Opinion, dated Sep. 24, 2015, issued in corresponding International Application No. PCT/JP2014/056117, 11 pages in English.
Communication dated Jul. 7, 2017, issued by the Intellectual Property Office of Taiwan in counterpart application No. 103108672.
Communication dated Nov. 15, 2017 from the Taiwanese Patent Office in counterpart Taiwanese application No. 103108672.

* cited by examiner

ADHESIVE SHEET, LAMINATE FOR TOUCH PANEL, AND CAPACITANCE-TYPE TOUCH PANEL

CROSS-REFERENCE TO RELATED APPLICATIONS

This application is a Continuation of PCT International Application No. PCT/JP2014/056117 filed on Mar. 10, 2014, which claims priority under 35 U.S.C. § 119(a) to Japanese Patent Application No. 2013-051051 filed on Mar. 13, 2013 and Japanese Patent Application No. 2013-156991 filed on Jul. 29, 2013. Each of the above applications is hereby expressly incorporated by reference, in its entirety, into the present application.

BACKGROUND OF THE INVENTION

The present invention relates to an adhesive sheet, particularly, an adhesive sheet in which the temperature dependence of a relative dielectric constant is equal to or less than a predetermined value, and the peel strength is equal to or greater than a predetermined value.

Furthermore, the present invention also relates to a laminate for a touch panel and a capacitance-type touch panel that include the aforementioned adhesive sheet.

In recent years, a touch panel has been more frequently mounted on cellular phones, mobile game consoles, and the like, and for example, a capacitance-type touch panel (hereinafter, also simply referred to as a "touch panel") that can perform multipoint detection has drawn attention.

Generally, at the time of manufacturing a touch panel, in order to bring members such as a display apparatus and a touch panel sensor into close contact with each other, a transparent adhesive sheet for enabling a user to see through it is used, and various adhesive sheets have been suggested. For example, in order to inhibit a decrease in detection sensitivity in a capacitance-type touch panel, JP 2012-140605 A discloses an adhesive sheet in which a relative dielectric constant is equal to or greater than a predetermined value.

Furthermore, JP 2012-512267 A discloses a pressure-sensitive adhesive which contains at least an acid anhydride-modified vinyl aromatic block copolymer, a metal chelate, and a tackifying resin.

SUMMARY OF THE INVENTION

Conventionally, in order to improve the touch sensitivity, as a material of an adhesive layer on the side of a touch screen, an acrylic material having excellent transparency and adhesiveness as disclosed in JP 2012-140605 A has been used.

Meanwhile, touch panels are required not to cause malfunctioning in various usage environments such as a cold region and a temperate region. Particularly, the touch panels are required not to cause malfunctioning in various usage environments, even after they are exposed to harsher conditions (for example, high-temperature and high-humidity conditions).

The inventors of the present invention prepared a touch panel by using the adhesive as described in JP 2012-140605 A, which contains an acrylic resin as a main component, and the pressure-sensitive adhesive as described in JP 2012-512267 A. As a result, they obtained knowledge that such a touch panel has a problem in that it frequently causes malfunctioning in a low-temperature environment or a high-temperature environment.

The present invention has been made under the aforementioned circumstances, and an object of the present invention is to solve the aforementioned problem and to provide an adhesive sheet which can inhibit the occurrence of malfunctioning of a capacitance-type touch panel in an environment of a wide temperature range from a low temperature to a high temperature.

Another object of the present invention is to provide a laminate for a touch panel and a capacitance-type touch panel that include the aforementioned adhesive sheet.

In order to achieve the aforementioned objects, the present inventors conducted intensive examination. As a result, they found that the objects can be achieved by the following constitution.

A first aspect of the present invention is an adhesive sheet in which temperature dependence of a relative dielectric constant that is determined by a test for evaluating temperature dependence, which will be described later, is equal to or less than 30%, and a 180° peel strength determined by a test for evaluating adhesiveness, which will be described later, is equal to or greater than 0.20 N/mm.

In the first aspect, it is preferable that the temperature dependence of a relative dielectric constant is equal to or less than 20%.

In the first aspect, it is preferable that the temperature dependence of a relative dielectric constant is equal to or less than 15%.

In the first aspect, it is preferable that the temperature dependence of a relative dielectric constant is equal to or less than 10%.

In the first aspect, it is preferable that the maximum value of the relative dielectric constants calculated at temperatures increased by 20° C. from −40° C. to 80° C. is equal to or less than 3.8.

In the first aspect, it is preferable that the maximum value of the relative dielectric constants calculated at temperatures increased by 20° C. from −40° C. to 80° C. is equal to or less than 3.6.

In the first aspect, it is preferable that the maximum value of the relative dielectric constants calculated at temperatures increased by 20° C. from −40° C. to 80° C. is equal to or less than 3.5.

In the first aspect, it is preferable that the adhesive sheet comprises an adhesive in which a ratio of a value of inorganicity (I value) to a value of organicity (O value) (ratio of I/O) is 0.05 to 0.30.

In the first aspect, it is preferable that the adhesive sheet comprises an adhesive in which a ratio of a value of inorganicity (I value) to a value of organicity (O value) (ratio of I/O) is 0.15 to 0.28.

A second aspect of the present invention is a laminate for a touch panel comprising the adhesive sheet of the first aspect and a capacitance-type touch panel sensor.

In the second aspect, it is preferable that the laminate for a touch panel further comprises a protective substrate, and in the laminate for a touch panel, the capacitance-type touch panel sensor, the adhesive sheet, and the protective substrate are laminated on each other in this order.

A third aspect of the present invention is a capacitance-type touch panel having at least a display apparatus, the adhesive sheet of the first aspect and a capacitance-type touch panel sensor in this order.

In the third aspect, it is preferable that a size of an input area, which can detect a contact state with an object, of the capacitance-type touch panel sensor is equal to or greater than 5 inches in a diagonal direction.

In the third aspect, it is preferable that a size of an input area, which can detect a contact state with an object, of the capacitance-type touch panel sensor is equal to or greater than 10 inches in a diagonal direction.

According to the present invention, it is possible to provide an adhesive sheet which can inhibit the occurrence of malfunctioning of a capacitance-type touch panel in an environment of a wide temperature range from a low temperature to a high temperature.

Furthermore, according to the present invention, it is possible to provide a laminate for a touch panel and a capacitance-type touch panel that include the aforementioned adhesive sheet.

DETAILED DESCRIPTION OF THE INVENTION

Figure 1:
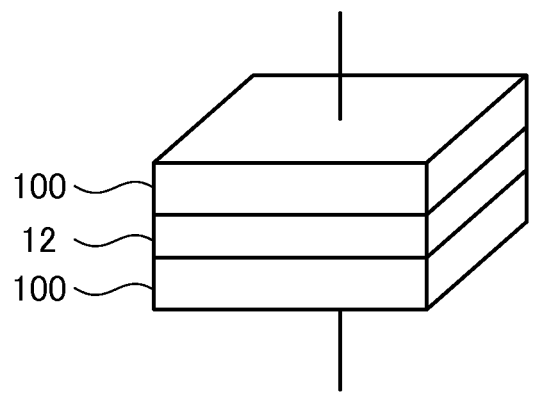
FIG. 1 is a schematic view of a sample for evaluation used in a test for evaluating temperature dependence.

Hereinafter, preferred embodiments of the adhesive sheet of the present invention will be described with reference to the drawings.

One of the characteristics of the adhesive sheet (optical adhesive sheet) of the present invention is that the temperature dependence of a relative dielectric constant thereof is controlled. The temperature dependence refers to a degree of a change in a relative dielectric constant depending on a temperature, although details thereof will be described later. Hereinafter, the reason why intended effects are obtained when the adhesive sheet is constituted as above will be specifically described.

The present inventors obtained the following knowledge with respect to JP 2012-140605 A. That is, in the case of the adhesive described therein, a dipole-dipole moment, which is derived from a large number of carbonyl groups present in poly(meth)acrylate as an adhesive, affects a relative dielectric constant, and accordingly, the relative dielectric constant greatly varies with the temperature of the usage environment.

The present inventors further obtained the following knowledge. When the adhesive sheet in which the relative dielectric constant greatly varies is used in a touch panel, for example, if the touch panel is operated by using a finger of a human being in a low-temperature environment with a temperature lower than a body temperature of a human being by at least 10° C., both a change in capacitance resulting from the actual operation and a change in capacitance resulting from a temperature change caused in the adhesive sheet due to the contact simultaneously occur. Because it takes a long period of time for the change in capacitance resulting from the temperature change to reach equilibrium, the contact position is incorrectly recognized, and this leads to operational failure. Therefore, if the temperature dependence of the relative dielectric constant of the adhesive sheet is controlled, it is possible to detect only the change in capacitance resulting from contact and to inhibit the occurrence of malfunctioning.

The occurrence of malfunctioning can also be inhibited by using a chipset circuit correcting the deviation of the capacitance. However, this method has a great disadvantage because the design cost or electric power load is increased.

Another characteristic of the adhesive sheet of the present invention is that a 180° peel strength thereof determined by a predetermined test for evaluating adhesiveness is equal to or greater than 0.20 N/mm. If the peel strength is within the above range, the temperature characteristics of the adhesive sheet are improved, and consequently, the effect of inhibiting malfunctioning is obtained as intended.

Hereinafter, embodiments of the adhesive sheet of the present invention will be specifically described.

(Adhesive Sheet)

The adhesive sheet is a layer for securing adhesiveness between members. Particularly, the adhesive sheet of the present invention is preferably used for a touch panel as described later.

In the adhesive sheet, the temperature dependence of a relative dielectric constant that is determined by a test for evaluating temperature dependence, which will be described later, is equal to or less than 30%. The temperature dependence is preferably equal to or less than 25%, more preferably equal to or less than 20%, even more preferably equal to or less than 15%, particularly preferably equal to or less than 10%, and most preferably equal to or less than 8%, because the malfunctioning of a touch panel hardly occurs in this range. The lower limit of the temperature dependence is not particularly limited. However, the smaller the lower limit, the better, so the lower limit is most preferably 0%.

When the temperature dependence of a relative dielectric constant is greater than 30%, the malfunctioning of a touch panel easily occurs.

The method for performing the test for evaluating temperature dependence will be specifically described below. Generally, the measurement of a relative dielectric constant using an impedance measurement technique at each temperature described below is called a capacitance method. Conceptually, the capacitance method is a method in which a condenser is formed by sandwiching a sample between electrodes, and a dielectric constant is calculated from the measured value of capacitance. As the electronic instruments equipped with a capacitance-type touch panel became mobile, the ubiquitous network society further progresses, and accordingly, electronic instruments such as touch panels are inevitably used in outdoor environments. Consequently, the temperature of the environment to which the electronic instruments are exposed is assumed to be −40° C. to 80° C., and thus the test for evaluating temperature dependence is performed in an environment with a temperature of −40° C. to 80° C.

First, as shown in FIG. 1, an adhesive sheet 12 (thickness: 100 μm to 500 μm) as a subject to be measured is sandwiched between a pair of aluminum electrodes 100 (electrode area: 20 mm×20 mm) and subjected to defoaming treatment under pressure for 60 minutes in an environment of 40° C. and 5 atm, thereby preparing a sample for evaluation.

Thereafter, the temperature of the adhesive sheet in the sample is stepwise increased by 20° C. from −40° C. to 80° C. At this time, at each temperature, the impedance is measured at 1 MHz by using an impedance analyzer (4294A manufactured by Agilent Technologies), thereby calculating a capacitance C. Subsequently, the determined capacitance C is multiplied by a thickness T of the adhesive sheet, and then the obtained value is divided by the product of an area S of the aluminum electrodes and a dielectric constant $\varepsilon_0$ ($8.854 \times 10^{-12}$ F/m) of vacuum, thereby calculating a relative dielectric constant. That is, by Equation (X): relative dielectric constant=(capacitance C×thickness T)/(area S×dielectric constant $\varepsilon_0$ of vacuum), the relative dielectric constant is calculated.

More specifically, the adhesive sheet is stepwise heated such that the temperature thereof becomes −40° C., −20° C., 0° C., 20° C., 40° C., 60° C., and 80° C.; the adhesive sheet is left as is for 5 minutes at each temperature until the temperature of the adhesive sheet is stabilized; the capacitance C is determined by measuring the impedance at 1 MHz at each temperature; and from the obtained value, the relative dielectric constant at each temperature is calculated.

Herein, the thicknesses of the adhesive sheet of at least five or more random points are measured, and the arithmetic mean thereof is taken as the thickness of the adhesive sheet.

Then, from the calculated relative dielectric constants, the minimum value and the maximum value are selected, and a ratio of a difference between the minimum and maximum values to the minimum value is determined. More specifically, a value (%) calculated by the equation [{(maximum value−minimum value)/minimum value}×100] is determined and taken as the temperature dependence.

Figure 2:
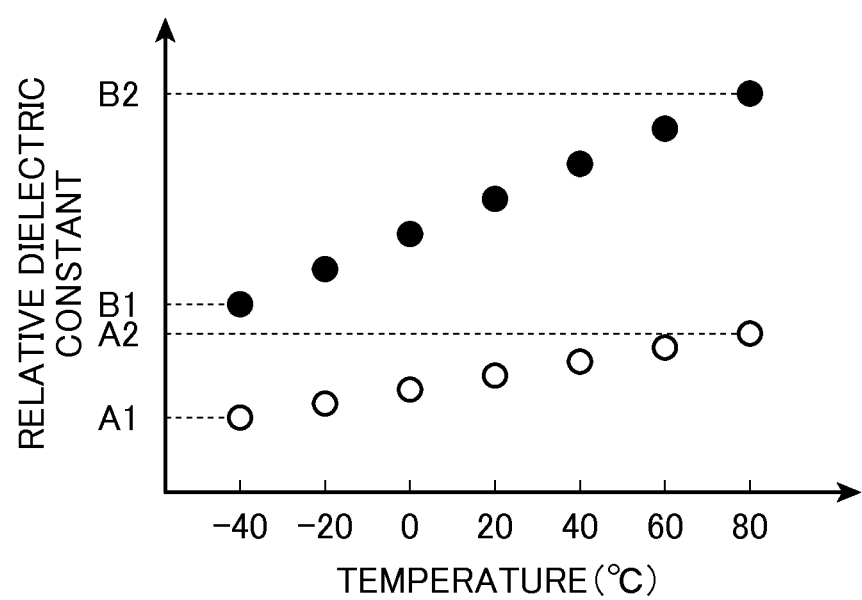
FIG. 2 is an example of results of the test for evaluating temperature dependence.

FIG. 2 shows an example of results of the test for evaluating temperature dependence. In FIG. 2, the abscissa indicates the temperature, and the ordinate indicates the relative dielectric constant. Furthermore, FIG. 2 shows an example of measurement results obtained from two kinds of adhesive sheets, in which white circles show the results obtained from one of the adhesive sheets, and black circles show the results obtained from the other.

As shown in FIG. 2, in an adhesive sheet A indicated by the white circles, the relative dielectric constants at the respective temperatures are relatively close to each other and vary by a small amount. That is, this shows that the temperature-dependent change of the relative dielectric constant of the adhesive sheet A is small, and the relative dielectric constant of the adhesive sheet A may not easily change even in a cold region and a temperate region. As a result, in a touch panel including the adhesive sheet A, the capacitance between detection electrodes does not easily deviate from an initially set value, and the malfunctioning does not easily occur. By selecting a minimum value A1 and a maximum value A2 of the white circles in FIG. 2, the temperature dependence (%) of the adhesive sheet A can be calculated from an equation [(A2−A1)/A1×100].

In contrast, in an adhesive sheet B indicated by the black circles, as the temperature is increased, the relative dielectric constant is greatly increased and changed. That is, this shows that the temperature-dependant change of the relative dielectric constant of the adhesive sheet B is great. In a touch panel including the adhesive sheet B, the capacitance between detection electrodes easily deviates from an initially set value, and the malfunctioning easily occurs. By selecting a minimum value B1 and a maximum value B2 of the black circles in FIG. 2, the temperature dependence (%) of the adhesive sheet B can be calculated from an equation [(B2−B1)/B1×100].

That is, the temperature dependence shows a degree of a temperature-dependent change of a dielectric constant. The smaller the value of the temperature dependence is, the more difficult it is for the relative dielectric constant to change over a range from a low temperature (−40° C.) to a high temperature (80° C.). Inversely, the greater the value of the temperature dependence is, the easier it is for the relative dielectric constant to change over a range from a low temperature (−40° C.) to a high temperature (80° C.)

There is no particular limitation on the value of the relative dielectric constant of the adhesive sheet at each temperature that is increased by 20° C. from −40° C. to 80° C.

Generally, when there is an insulator between conductive materials such as electrodes, the capacitance C of the insulator between the electrodes is equal to dielectric constant ε×area S÷layer thickness T, and the dielectric constant ε is equal to relative dielectric constant $\varepsilon_r$×dielectric constant $\varepsilon_0$ of vacuum.

In a capacitance-type touch panel, the adhesive sheet is disposed between a capacitance-type touch panel sensor and a protective substrate (covering member), between a capacitance-type touch panel sensor and a display apparatus, or between a substrate in a capacitance-type touch panel sensor and conductive films having detection electrodes arranged on the substrate, and the adhesive sheet has parasitic capacitance in itself. An increase in the parasitic capacitance of the adhesive sheet can be one of the causes of the malfunctioning of touch sensing. Therefore, the increase in the parasitic capacitance of the adhesive layer, which is adjacent to a sensing portion (input region) of the capacitance-type touch panel sensor, results in charging failure in each of the sensing sites of a sensing portion that can detect the contact state with an object. Accordingly, the increase in the parasitic capacitance of the adhesive layer can be one of the causes of the malfunctioning.

Furthermore, in recent years, as the area of capacitance-type touch panels has been increased, the total number of grid lines (corresponding to the detection electrodes which will be described later) of an interface sensor portion tends to be increased. In order to obtain appropriate sensing sensitivity, a scan rate should be increased in response to the increase in the number of the grid lines, and the threshold of the capacitance of each of the grid lines or sensor nodes should be decreased. In doing so, the influence exerted by the parasitic capacitance of the aforementioned adhesive layer adjacent to the sensing portion is relatively increased, and an environment in which the malfunctioning easily occurs is created. Therefore, in order to reduce the parasitic capacitance of the adhesive layer adjacent to the sensing portion, means for decreasing the dielectric constant ε of the adhesive layer is adopted.

Accordingly, the maximum value of the relative dielectric constants of the adhesive sheet calculated at temperatures increased by 20° C. from −40° C. to 80° C. is preferably equal to or less than 3.8, more preferably equal to or less than 3.6, and even more preferably equal to or less than 3.5.

The method for measuring a relative dielectric constant is performed under the same procedure as in the test for evaluating temperature dependence.

The 180° peel strength of the adhesive sheet determined by a test for evaluating adhesiveness that will be described later is equal to or greater than 0.20 N/mm and preferably equal to or greater than 0.25 N/mm. The upper limit thereof is not particularly limited, but generally, the upper limit is equal to or less than 1.2 N/mm in many cases, equal to or less than 0.8 N/mm in more cases, and equal to or less than 0.3 N/mm in even more cases. If the peel strength is within the above range, the adhesive sheet exhibits a predetermined elasticity. Therefore, even when various members are deformed due to the temperature change, the adhesive sheet can follow the deformation.

Consequently, when the adhesive sheet is used between a capacitance-type touch panel sensor and a protective substrate (covering member), between a capacitance-type touch panel sensor and a display apparatus, or between a substrate in a capacitance-type touch panel sensor and conductive films having detecting electrodes disposed on the substrate, excellent adhesive holding strength is maintained in a wide temperature range, and the malfunctioning of the touch panel resulting from a time-dependent denaturation or the like does not easily occur.

As a measurement method of the test for evaluating adhesiveness, an adhesive sheet is bonded to a glass substrate, and the 180° peel strength of the adhesive sheet is measured by the method based on "10.4 Measurement of peel adhesion" in JIS Z0237.

More specifically, an adhesive sheet (a width of 25 mm×a length of 40 mm to 50 mm) is caused to face the vicinity of the center of a glass plate (equal to or greater than 40 mm×equal to or greater than 60 mm). In this state, the adhesive sheet and the glass plate are bonded to each other at 10 kPa to 40 kPa such that the longitudinal directions thereof match up with each other. Thereafter, a Kapton film (a width of 25 mm×a length of equal to or greater than 150 mm) is placed on an exposed surface of the adhesive sheet, such that a longitudinal direction thereof matches up with the longitudinal direction of the adhesive sheet. In this state, the Kapton film and the adhesive sheet are bonded to each other, such that one end of the Kapton film does not come into contact with the adhesive sheet, and the entire region of the adhesive sheet is covered with the Kapton film, thereby obtaining a laminate. Subsequently, the one end of the Kapton film that does not come into contact with the adhesive sheet is set in an autograph (manufactured by Shimadzu Corporation) such that the Kapton film is pulled (peeled) back at an angle of 180°, and the peel strength is measured.

The thickness of the adhesive sheet is not particularly limited, but is preferably 5 μm to 2,500 μm and more preferably 20 μm to 500 μm. If the thickness of the adhesive sheet is within the above range, intended visible light transmittance is obtained, and it is easy to handle the adhesive sheet.

The adhesive sheet may be a laminate in which a plurality of adhesive sheets composed of different constituents is laminated on each other. When the adhesive sheet has a laminated structure, the temperature dependence of the relative dielectric constant thereof is designed such that it falls into the range of the present invention in the laminated state.

The adhesive sheet is preferably optically transparent. That is, the adhesive sheet is preferably a transparent adhesive sheet. The state in which the adhesive sheet is optically transparent means that a total light transmittance thereof is equal to or greater than 85%. The total light transmittance is preferably equal to or greater than 90%, and more preferably equal to or greater than 95%.

The type of the material (adhesive) constituting the adhesive sheet is not particularly limited, as long as the aforementioned temperature dependence and the aforementioned peel strength are satisfied. Examples of the material include an acryl-based adhesive, a rubber-based adhesive, a silicone-based adhesive, and the like. Herein, the acryl-based adhesive is an adhesive containing a polymer ((meth)acryl polymer) of either or both of an acryl monomer and a methacryl monomer. The acryl-based adhesive contains the aforementioned polymer as a base polymer, and other components (a tackifying agent, a rubber component, and the like) may be contained in the acryl-based adhesive.

Herein, the (meth)acryl polymer conceptually includes both an acryl polymer and a methacryl polymer.

Examples of monomers ((meth)acrylate monomers) used for manufacturing the aforementioned (meth)acryl polymer include methyl (meth)acrylate, ethyl (meth)acrylate, butyl (meth)acrylate, isobutyl (meth)acrylate, t-butyl (meth)acrylate, cyclohexyl (meth)acrylate, tetrahydrofurfuryl (meth)acrylate, 2-ethylhexyl (meth)acrylate, dodecyl (meth)acrylate, isononyl (meth)acrylate, isodecyl (meth)acrylate, stearyl (meth)acrylate, 2-hydroxyethyl (meth)acrylate, 2-hydroxypropyl (meth)acrylate, 2-hydroxybutyl (meth)acrylate, isobornyl (meth)acrylate, butoxydiethylene glycol (meth)acrylate, benzyl (meth)acrylate, dicyclohexyl (meth)acrylate, 2-dicyclohexyloxyethyl (meth)acrylate, morpholino (meth)acrylamide, phenoxyethyl (meth)acrylate, dimethylaminoethyl (meth)acrylate, ethylene glycol di(meth)acrylate, 1,4-butanediol dimethacrylate, neopentyl glycol di(meth)acrylate, 1,6-hexanediol di(meth)acrylate, trimethylolpropane tri(meth)acrylate, nonanediol di(meth)acrylate, tris(2-acryloyloxyethyl) isocyanurate, 2-morpholinoethyl (meth)acrylate, 9-anthryl methacrylate, 2,2-bis(4-methacryloxyphenyl)propane, pentaerythritol tetra(meth)acrylate, dipentaerythritol hexa(meth)acrylate, trans-1,4-cyclohexanediol dimethacrylate, and the like.

Herein, "(meth)acrylate" is a generic term that means both acrylate and methacrylate.

One of the preferred embodiments of the adhesive sheet is an embodiment containing the acryl-based adhesive. Particularly, it is preferable that the adhesive sheet contains a (meth)acryl polymer having a repeating unit derived from a (meth)acrylate monomer which has a hydrocarbon group containing at least four or more carbon atoms. Herein, the (meth)acrylate monomer conceptually includes both an acrylate monomer and a methacrylate monomer.

Examples of the (meth)acrylate monomer having four or more carbon atoms include 2-ethylhexyl (meth)acrylate, n-octyl (meth)acrylate, isooctyl (meth)acrylate, n-nonyl (meth)acrylate, isononyl (meth)acrylate, n-decyl (meth)acrylate, isodecyl (meth)acrylate, n-dodecyl (meth)acrylate, n-tridecyl (meth)acrylate, n-tetradecyl (meth)acrylate, n-hexadecyl (meth)acrylate, stearyl (meth)acrylate, isobornyl (meth)acrylate, dicyclopentenyl (meth)acrylate, dicyclopentanyl (meth)acrylate, dicyclopentenyloxyethyl (meth)acrylate, and the like.

Examples of the (meth)acrylate monomer having an aliphatic hydrocarbon group containing four or more carbon atoms include a (meth)acrylate monomer having a chain-like aliphatic hydrocarbon group containing four or more carbon atoms and a (meth)acrylate monomer having a cyclic aliphatic hydrocarbon group containing four or more carbon atoms. In view of further inhibiting the occurrence of malfunctioning of the touch panel including the adhesive sheet (hereinafter, this will be simply described as "in view of further improving the effects of the present invention"), the number of carbon atoms is preferably equal to or greater than 6, more preferably 6 to 20, and even more preferably 8 to 16.

One of the preferred embodiments of the (meth)acryl polymer is a (meth)acryl polymer having a repeating unit derived from a (meth)acrylate monomer having a chain-like hydrocarbon group containing four or more carbon atoms and a repeating unit derived from a (meth)acrylate monomer having a cyclic aliphatic hydrocarbon group containing four or more carbon atoms.

Within a scope that does not reduce the effects of the present invention, the (meth)acryl polymer may contain a repeating unit derived from a monomer (for example, carboxylic acid-containing (meth)acrylate (such as acrylic acid) or a hydroxyl group-containing (meth)acrylate (such as 2-hydroxyethyl acrylate)) other than those described above.

Furthermore, the (meth)acryl polymer may have a crosslinked structure. The method for forming the crosslinked structure is not particularly limited. Examples of the method include a method of using a bifunctional (meth)acrylate monomer, a method of introducing a reactive group (for example, a hydroxyl group) into the (meth)acryl polymer and reacting the reactive group with a crosslinking agent reactive to the reactive group, and the like. Specific examples of the latter method include a method of preparing an adhesive layer by reacting a (meth)acryl polymer, which has a repeating unit derived from a (meth)acrylate monomer having one or more kinds of active hydrogen-containing groups selected from the group consisting of a hydroxyl group, a primary amino group, and a secondary amino group, with an isocyanate-based crosslinking agent (a compound having two or more isocyanate groups).

The content of the (meth)acryl polymer in the adhesive sheet is not particularly limited. However, in view of further improving the adhesiveness of the adhesive sheet and further improving the effects of the present invention, the content of the (meth)acryl polymer is preferably 10% by mass to 50% by mass, and more preferably 15% by mass to 40% by mass, with respect to the total mass of the adhesive sheet.

The adhesive sheet may further contain a tackifying agent.

The tackifying agent may be appropriately selected from those known in the field of patch or patch preparation. Examples of the tackifying agent include a petroleum-based resin (for example, an aromatic petroleum resin, an aliphatic petroleum resin, an aliphatic/aromatic mixed petroleum-based resin, a petroleum resin derived from a C9 fraction, or the like), a terpene-based resin (for example, an α pinene resin, a β pinene resin, a resin obtained by copolymerizing a mixture of any of α pinene, β pinene, and dipentene, a terpene phenol copolymer, a hydrogenated terpene phenol resin, an aromatic modified hydrogenated terpene resin, or an abietic acid ester-based resin), a rosin-based resin (for example, a partially hydrogenated gum rosin resin, an erythritol-modified wood rosin resin, a tall oil rosin resin, a wood rosin resin, gum rosin, rosin-modified maleic acid resin, polymerized rosin, rosin phenol, or a rosin ester), a coumarone indene resin (for example, a coumarone indene styrene copolymer), and the like.

One kind of the tackifying agent may be used alone, or two or more kinds thereof may be used in combination. When two or more kinds of tackifying agents are used in combination, for example, different kinds of resins may be combined with each other, or the same type of resins that differ from each other in terms of a softening point may be combined with each other.

The content of the tackifying agent in the adhesive sheet is not particularly limited. In view of further improving the adhesiveness of the adhesive sheet, and further improving the effects of the present invention, the content of the tackifying agent is preferably 10% by mass to 60% by mass, and more preferably 20% by mass to 50% by mass, with respect to the total mass of the adhesive sheet.

The adhesive sheet may further contain a rubber component (softening agent).

Examples of the rubber component include a polyolefin, a modified polyolefin, and the like. Examples of the rubber component also include natural rubber, polyisobutylene, polybutadiene (modified liquid polybutadiene, a polymer of 1,4-butadiene, 1,2-butadiene or a copolymer mixture thereof, or the like), hydrogenated polyisoprene, hydrogenated polybutadiene, polyisoprene, polybutadiene, polybutene, a styrene butadiene copolymer, a copolymer or a polymer mixture of a combination randomly selected from the group consisting of the above components, and the like.

The content of the rubber component in the adhesive sheet is not particularly limited. However, in view of further improving the adhesiveness of the adhesive sheet and further improving the effects of the present invention, the content of the rubber component is preferably 20% by mass to 75% by mass, and more preferably 25% by mass to 60% by mass, with respect to the total mass of the adhesive sheet.

One of the preferred embodiments of the adhesive sheet is an adhesive sheet obtained by performing curing treatment on an adhesive composition containing a (meth)acrylate monomer having a hydrocarbon group containing at least eight or more carbon atoms. The definition of the (meth)acrylate monomer is as described above.

The aforementioned adhesive composition preferably contains the aforementioned tackifying agent.

Furthermore, the adhesive composition preferably contains the aforementioned rubber composition. Moreover, the adhesive composition may contain a rubber component having a polymerizable group as the rubber component. More specifically, examples of the rubber component include one kind which has a (meth)acryloyl group and is selected from the group consisting of polybutadiene, polyisoprene, hydrogenated polybutadiene, and hydrogenated polyisoprene. That is, the adhesive composition may contain a rubber component having a polymerizable group and a rubber component not having a polymerizable group. Examples of the polymerizable group include a known radically polymerizable group (a vinyl group, a (meth)acryloyl group, or the like) and a known cationically polymerizable group (an epoxy group or the like).

The content of the tackifying agent in the adhesive composition is not particularly limited. However, it is preferably 80 parts by mass to 320 parts by mass, and more preferably 120 parts by mass to 270 parts by mass, with respect to 100 parts by mass of the (meth)acrylate monomer.

The content of the rubber component in the adhesive composition is not particularly limited. However, it is preferably 70 parts by mass to 320 parts by mass, and more preferably 100 parts by mass to 280 parts by mass, with respect to 100 parts by mass of the (meth)acrylate monomer.

The adhesive composition may contain additives (for example, a polymerization initiator, a thermosetting agent, an antioxidant, transparent particles, a plasticizer, and the like) other than the aforementioned components.

For example, as a polymerization initiator, it is possible to use a photopolymerization initiator such as (1-hydroxy) cyclohexyl phenyl ketone or acyl phosphine oxide, or a thermal polymerization initiator such as azobisalkylnitrile or perbutyl.

As a thermosetting agent, for example, polyvalent isocyanate, an epoxy-based or oxetane-based thermosetting agent, or the like is selected.

As an antioxidant, for example, it is possible to use known hindered phenol (pentaerythritol tetrakis[3-(3,3-di-tert-butyl-4-hydroxyphenyl)propionate], 2,4-bis(octylthiomethyl) orthocresol), or hindered amine.

As transparent particles, optically micro-sized particles (nanosilica and the like) that cannot be visually recognized can be appropriately used as long as such particles are not contrary to the present invention.

The procedure of manufacturing the adhesive sheet from the aforementioned adhesive composition is not particularly limited, and a known method can be adopted. For example, the adhesive sheet can be manufactured by a method in which a predetermined substrate (for example, a peelable substrate) is coated with the adhesive composition, drying treatment is then performed on the composition if necessary, and the aforementioned curing treatment is performed on the composition.

Examples of the coating method include known methods. For example, a known coating apparatus such as an applicator, a gravure coater, a curtain coater, a comma coater, a slot die coater, or a lip coater is used.

Examples of the curing treatment performed on the adhesive composition include photocuring treatment and thermosetting treatment. In other words, it is preferable that the adhesive sheet is formed by curing a photocurable adhesive or a thermosetting adhesive. As the adhesive composition (curable composition) used for curing, according to the characteristics of a curing reaction, not only a monomer mixture but also an adhesive composition, which is obtained by blending a polymer obtained by polymerizing a monomer beforehand with a monomer or a polymer having curing reactivity, may be used.

The photocuring treatment may include curing steps performed plural times, and the wavelength of light used may be appropriately selected from a plurality of wavelengths. Furthermore, the thermosetting treatment may include curing steps performed plural times, and the heating means may be selected from appropriate means such as an oven, a reflow furnace, and an IR heater. In addition, the photocuring treatment and the thermosetting treatment may be appropriately combined with each other.

Particularly, if the adhesive sheet is formed by the photocuring treatment, the time-dependent deformation thereof is relatively small, and accordingly, in view of manufacturing suitability, the photocuring treatment is preferable. In the case of the photocuring treatment, the photocurable adhesive may contain a photopolymerization initiator.

As the material constituting the adhesive sheet, it is preferable to use a material that can be obtained by forming a resin composition, which contains one or more kinds of rubber components (for example, polyolefins or modified polyolefins), one or more kinds of (meth)acrylate monomers, one or more kinds of tackifying agents, and a polymerization initiator (for example, a photopolymerization initiator or a thermal polymerization initiator) or a thermosetting agent, in the form of a film and polymerizing the resin composition by using light or heat.

There is no particular limitation on a ratio of a value of inorganicity (I value) to a value of organicity (O value) (ratio of I/O) of the adhesive used in the adhesive sheet. However, in view of further improving the effects of the present invention, the ratio of I/O is preferably equal to or greater than 0.05 and equal to or less than 0.30, more preferably 0.08 to 0.30, even more preferably 0.12 to 0.28, and particularly preferably 0.15 to 0.28. If the ratio of I/O is equal to or greater than 0.05, the adhesiveness of the adhesive is easily secured. If the ratio of I/O is equal to or less than 0.30, the temperature dependence of the relative dielectric constant is reduced, and the malfunctioning of the touch panel does not easily occur.

Hereinafter, the ratio of I/O will be specifically described.

The aforementioned ratio (ratio of I/O) of the value of inorganicity (I value) to the value of organicity (O value) is calculated by a calculating method in an organic conceptual diagram.

The organic conceptual diagram was suggested by Fujita et al., and it is effective means for predicting various physicochemical properties from the chemical structure of an organic compound (see Koda Yoshio, "Organic Conceptual Diagram-Fundamental and Application", SANKYO PUBLISHING Co., Ltd. (1984)). The polarity of an organic compound depends on the number of carbon atoms or substituents thereof. Therefore, according to the organic conceptual diagram, based on a case in which the value of organicity of a methylene group is regarded as being 20 and the value of inorganicity of a hydroxyl group is regarded as being 100, the values of inorganicity and organicity of other substituents are determined, and the values of inorganicity and organicity of organic compounds are calculated. An organic compound having a large value of inorganicity has high polarity, and an organic compound having a large value of organicity has low polarity.

The values of organicity and inorganicity of main groups that were obtained by Fujita are summarized in the following Table 1.

TABLE 1

| Group | Value of inorganicity | Value of organicity |
|---|---|---|
| —COOH | 150 | 0 |
| —OH | 100 | 0 |
| —O—CO—O— | 80 | 0 |
| —CO)— | 65 | 0 |
| —COOR | 60 | 0 |
| —O— | 20 | 0 |
| Triple bond | 3 | 0 |
| Triple bond | 2 | 0 |
| $CH_2$ | 0 | 20 |

As is evident from Table 1, the compound having a large value of organicity mainly contains a large number of $CH_2$. Accordingly, it is understood that the compound in which the ratio of I/O is small is a compound which contains a small amount of a polar group such as an —OH group or a —COOR group and is mainly constituted with $CH_2$ (a methylene group).

As described above, examples of the preferred embodiments of the adhesive contained in the adhesive sheet of the present invention include an adhesive in which the ratio of I/O is equal to or less than 0.30 that is a relatively small value. Such an adhesive corresponds to the compound which contains a small amount of a polar group such as a —OH group or a —COOR group and is mainly constituted with $CH_2$, as described above.

There is a certain correlation between the aforementioned temperature dependence and the ratio of I/O, and a compound in which the ratio of I/O is small exhibits a relatively small degree of temperature dependence. The reason is as follows. As described above, when the adhesive contains a large number of polar groups such as carbonyl groups, due to a dipole-dipole moment derived from the groups, the relative dielectric constant of the adhesive greatly varies with the temperature. That is, the temperature dependence is relatively increased.

In contrast, as described above, a compound in which the ratio of I/O is small contains a small amount of polar groups. Accordingly, the relative dielectric constant of the adhesive does not easily vary with the temperature, and as a result, the temperature dependence is reduced.

The value of organicity (O value) and the value of inorganicity (I value) of the adhesive and the ratio (ratio of I/O) thereof can be calculated according to the method described in the aforementioned book. Furthermore, for the polymer containing a repeating unit and the adhesive as a mixture of the polymers, the O value, the I value, and the ratio of I/O can be calculated based on the method described in the aforementioned book.

The actual and specific method for calculating the I value, the O value, and the ratio of I/O has been opened to the public (http://www.ecosci.jp/sheet/orgs help.html) as an organic conceptual diagram calculation sheet for Excel by Honma et al. who are co-authors of the aforementioned "Organic Conceptual Diagram-Fundamental and Application". Therefore, the I value, the O value, and the ratio of I/O can be calculated by using the calculation sheet.

(Method for Manufacturing Adhesive Sheet)

The method for manufacturing the adhesive sheet of the present invention is not particularly limited. Examples of the method include a method for manufacturing the adhesive sheet in which a release film is coated with a composition for forming an adhesive sheet, and then curing treatment is performed on the composition if necessary. As the coating method, for example, a method of using a lip coater, a comma coater, a gravure coater, a slot die coater, or an applicator, an air knife method, a curtain coating method, or the like is appropriately used. Examples of the curing method include a method in which thermosetting or UV curing is performed in a single step or multiple steps and a method as a composite process thereof.

The adhesive sheet is used in a capacitance-type touch panel and disposed in the touch panel so as to bring the respective members into close contact with each other.

Figure 3:
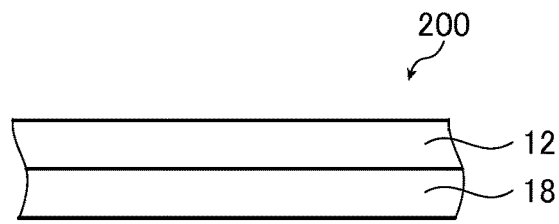
FIG. 3 is a cross-sectional view of a first embodiment of a laminate for a touch panel of the present invention.

For example, as shown in FIG. 3, the adhesive sheet 12 may constitute a laminate 200 for a touch panel by being disposed on a capacitance-type touch panel sensor 18.

Figure 4:
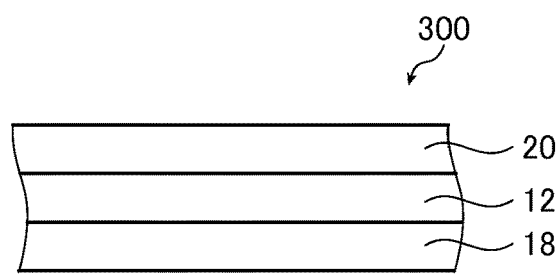
FIG. 4 is a cross-sectional view of a second embodiment of the laminate for a touch panel of the present invention.

Furthermore, as shown in FIG. 4, the adhesive sheet 12 may constitute a laminate 300 for a touch panel by being disposed between a protective substrate 20 and the capacitance-type touch panel sensor 18.

Figure 5A:
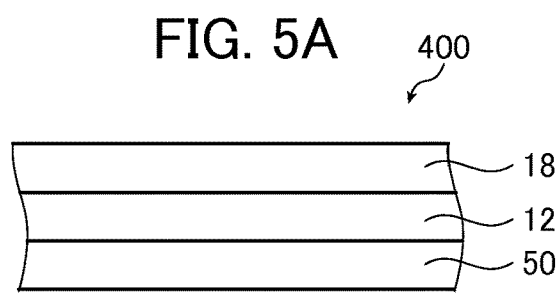
FIGS. 5A and 5B are cross-sectional views of capacitance-type touch panels of the present invention.

Moreover, as shown in FIG. 5A, the adhesive sheet 12 may constitute a capacitance-type touch panel 400 by being disposed between a display apparatus 50 and the capacitance-type touch panel sensor 18.

Figure 5B:
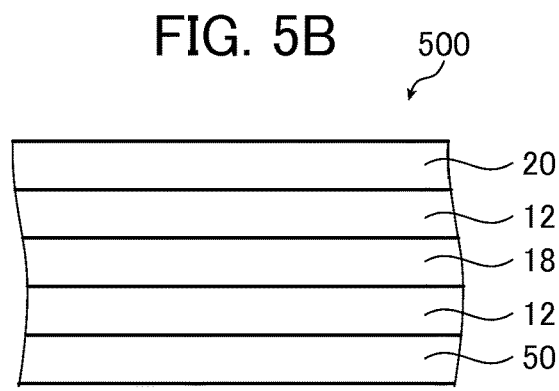

In addition, as shown in FIG. 5B, the adhesive sheet 12 may constitute a capacitance-type touch panel 500 by being disposed between the display apparatus 50 and the capacitance-type touch panel sensor 18 and between the capacitance-type touch panel sensor 18 and the protective substrate 20.

Hereinafter, various members used in the laminate for a touch panel and in the capacitance-type touch panel will be specifically described.

(Capacitance-Type Touch Panel Sensor)

The capacitance-type touch panel sensor 18 is a sensor which is disposed on a display apparatus (on the side of an operator) and detects the position of an external conductor such as a finger of a human being by utilizing the change in capacitance that is caused when the external conductor such as a finger of a human being comes into contact with (approaches) the sensor.

The constitution of the capacitance-type touch panel sensor 18 is not particularly limited. However, generally, the capacitance-type touch panel sensor 18 has detection electrodes (particularly, detection electrodes which extend in an X-direction and detection electrodes which extend in a Y-direction). By detecting the change in capacitance of the detection electrode that is caused when a finger comes into contact with or approaches the detection electrode, the capacitance-type touch panel sensor 18 identifies the coordinates of the finger.

Figure 6:
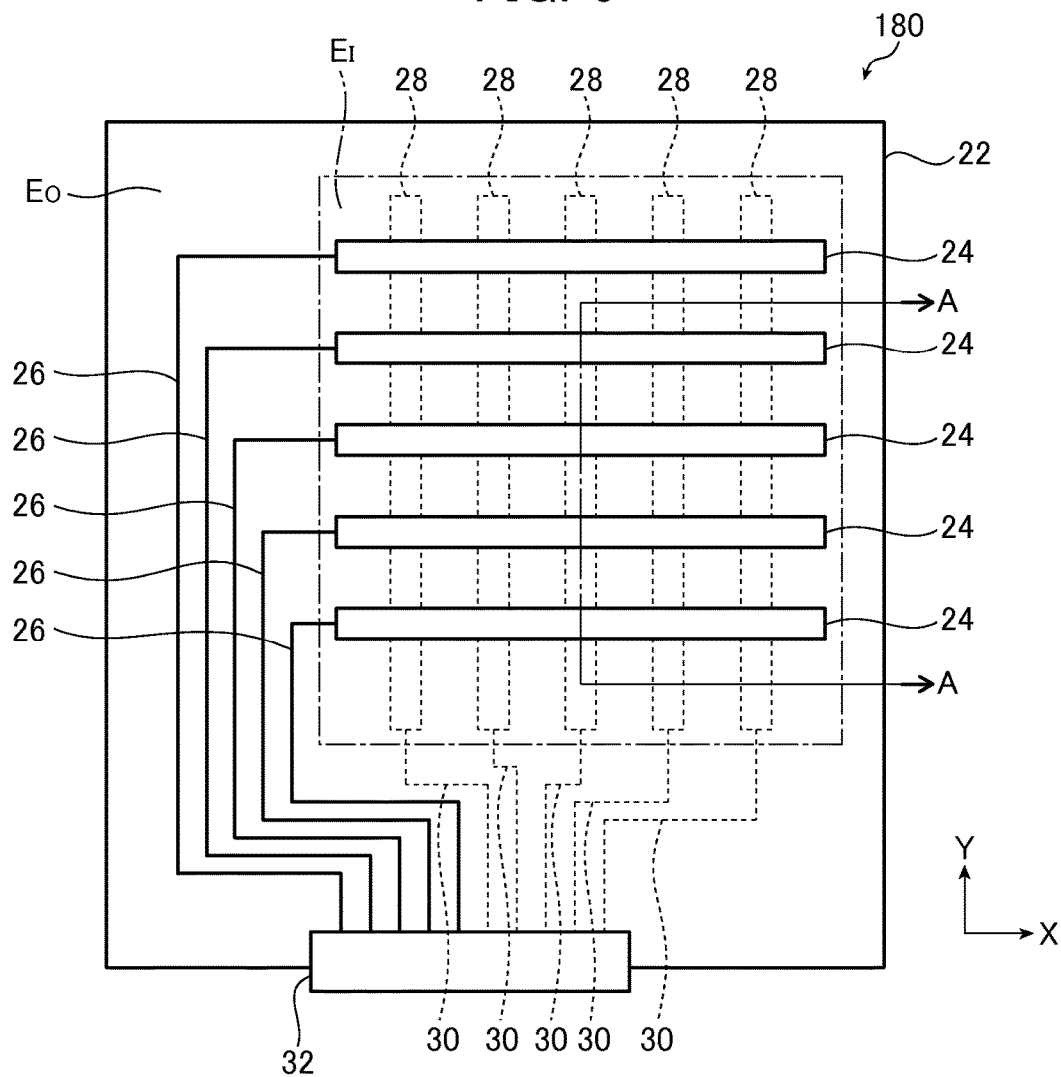
FIG. 6 is a plan view of an embodiment of a capacitance-type touch panel sensor.

A preferred embodiment of the capacitance-type touch panel sensor 18 will be specifically described by using FIG. 6.

Figure 7:
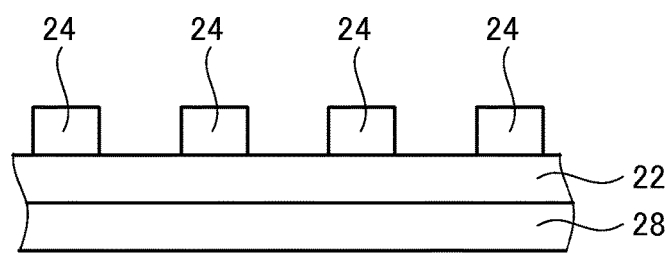
FIG. 7 is a cross-sectional view taken along the cutting line A-A shown in FIG. 6.

FIG. 6 is a plan view of a capacitance-type touch panel sensor 180. FIG. 7 is a cross-sectional view taken along the cutting line A-A in FIG. 6. The capacitance-type touch panel sensor 180 includes a substrate 22, first detection electrodes 24 disposed on a main surface on one side of the substrate 22 (front surface), first lead-out wiring 26, second detection electrodes 28 disposed on a main surface on the other side of the substrate 22 (rear surface), second lead-out wiring 30, and a flexible printed wiring board 32. Herein, the region in which the first detection electrodes 24 and the second detection electrodes 28 are disposed constitutes an input region $E_I$ (an input region (a sensing portion) that can detect the contact state with an object) in which a user can perform an input operation, and in an outside region $E_O$ positioned outside the input region $E_I$, the first lead-out wiring 26, the second lead-out wiring 30, and the flexible printed wiring board 32 are disposed.

Hereinafter, the above constitution will be specifically described.

The substrate 22 is a member that plays a role of supporting the first detection electrodes 24 and the second detection electrodes 28 in the input region $E_I$ and plays a role of supporting the first lead-out wiring 26 and the second lead-out wiring 30 in the outside region $E_O$.

It is preferable that the substrate 22 appropriately transmits light. Specifically, the total light transmittance of the substrate 22 is preferably 85% to 100%.

It is preferable that the substrate 22 has insulating properties (it is preferable that the substrate 22 is an insulating substrate). That is, the substrate 22 is a layer for securing insulating properties between the first detection electrodes 24 and the second detection electrodes 28.

The substrate 22 is preferably a transparent substrate (particularly, a transparent insulating substrate). Specific examples of the substrate 22 include an insulating resin substrate, a ceramic substrate, a glass substrate, and the like. Among these, an insulating resin substrate is preferable since it is excellent in toughness.

More specifically, examples of the material constituting the insulating resin substrate include polyethylene terephthalate, polyether sulfone, a polyacrylic resin, a polyurethane-based resin, polyester, polycarbonate, polysulfone, polyamide, polyarylate, polyolefin, a cellulose-based resin, polyvinyl chloride, a cycloolefin-based resin, and the like. Among these, polyethylene terephthalate, a cycloolefin-based resin, polycarbonate, and a triacetyl cellulose resin are preferable since these are excellent in transparency.

Although the substrate 22 in FIG. 6 is a single layer, the substrate 22 may be a multilayer composed of two or more layers.

The thickness of the substrate 22 (when the substrate 22 is a multilayer composed of two or more layers, which is the total thickness thereof) is not particularly limited. However, the thickness is preferably 5 μm to 350 μm, and more preferably 30 μm to 150 μm. If the thickness is within the above range, the intended visible light transmittance is obtained, and it is easy to handle the substrate 22.

The substrate 22 shown in FIG. 6 has substantially a rectangular shape when seen in a plan view. However, the shape of the substrate 22 is not limited thereto and may be circular or polygonal, for example.

The first detection electrodes 24 and the second detection electrodes 28 are sensing electrodes sensing the change in capacitance and constitute a sensor portion. That is, when a finger tip comes into contact with the touch panel, the mutual capacitance between the first detection electrodes 24 and the second detection electrodes 28 changes, and based on the amount of change, the position of the fingertip is calculated by an IC circuit.

The first detection electrodes 24 play a role of detecting an input position of a user's finger, which approaches the input region $E_f$, in the X-direction, and have a function of generating capacitance between the first detection electrodes 24 and the finger. The first detection electrodes 24 are electrodes that extend in a first direction (X-direction) and are arranged in a second direction (Y-direction) orthogonal to the first direction at a predetermined interval. The first detection electrodes 24 have a predetermined pattern as described later.

The second detection electrodes 28 play a role of detecting an input position of a user's finger, which approaches the input region $E_f$, in the Y-direction, and have a function of generating capacitance between the second detection electrodes 28 and the finger. The second detection electrodes 28 are electrodes that extend in the second direction (Y-direction) and are arranged in the first direction (X-direction) at a predetermined interval. The second detection electrodes 28 have a predetermined pattern as described later. In FIG. 6, the capacitance-type touch panel sensor 180 has five first detection electrodes 24 and five second detection electrodes 28. However, the number of the electrodes is not particularly limited and just needs to be a plural number.

Figure 8:
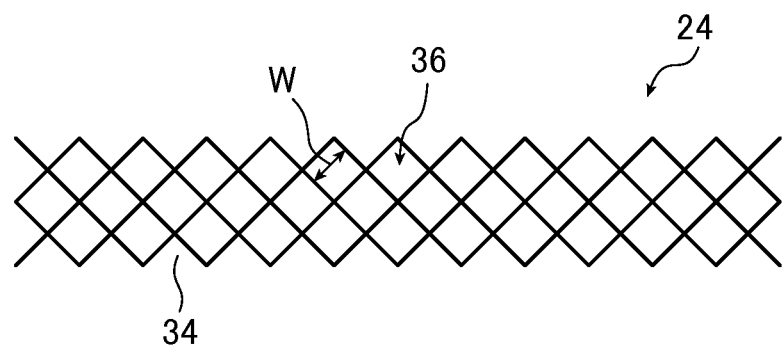
FIG. 8 is an enlarged plan view of a first detection electrode.

In FIG. 6, the first detection electrodes 24 and the second detection electrodes 28 are constituted with thin conductive wires. FIG. 8 is an enlarged plan view showing a portion of the first detection electrode 24. As shown in FIG. 8, the first detection electrode 24 is constituted with thin conductive wires 34 and includes a plurality of lattices 36 formed by the thin conductive wires 34 crossing each other. Just like the first detection electrode 24, the second detection electrode 28 also includes the plurality of lattices 36 formed by the thin conductive wires 34 crossing each other.

Examples of the material of the thin conductive wires 34 include a metal such as gold (Au), silver (Ag), copper (Cu), or aluminum (Al), an alloy, a metal oxide such as ITO, tin oxide, zinc oxide, cadmium oxide, gallium oxide, or titanium oxide, and the like. Among these, silver is preferable since conductivity of the thin conductive wires 34 becomes excellent.

From the viewpoint of the adhesiveness between the thin conductive wires 34 and the substrate 22, the thin conductive wires 34 preferably contain a binder.

The binder is preferably a water-soluble polymer since the adhesiveness between the thin conductive wires 34 and the substrate 22 is further improved. Examples of the types of the binder include gelatin, carrageenan, polyvinyl alcohol (PVA), polyvinylpyrrolidone (PVP), polysaccharides such as starch, cellulose and derivatives thereof, polyethylene oxide, polyvinyl amine, chitosan, polylysine, polyacrylic acid, polyalginic acid, polyhyaluronic acid, carboxycellulose, gum Arabic, sodium alginate, and the like. Among these, gelatin is preferable since the adhesiveness between the thin conductive wires 34 and the substrate 22 is further improved.

Herein, as gelatin, in addition to lime-treated gelatin, acid-treated gelatin may be used. Moreover, it is possible to use a hydrolysate of gelatin, an enzymatic decomposition product of gelatin, and gelatin modified with an amino group or a carboxyl group (phthalated gelatin or acetylated gelatin).

As the binder, a polymer different from the aforementioned gelatin (hereinafter, the polymer will be also simply referred to as a "polymer") may be used together with gelatin.

The type of the polymer used is not particularly limited as long as it is different from gelatin. Examples of the polymer include at least any resin selected from the group consisting of an acryl-based resin, a styrene-based resin, a vinyl-based resin, a polyolefin-based resin, a polyester-based resin, a polyurethane-based resin, a polyamide-based resin, a polycarbonate-based resin, a polydiene-based resin, an epoxy-based resin, a silicone-based resin, a cellulose-based polymer, a chitosan-based polymer, a copolymer composed of a monomer constituting theses resins, and the like.

Particularly, examples of preferred embodiments of the polymer include a polymer (copolymer) represented by the following Formula (1) since the polymer can further prevent the permeation of moisture.

-(A)$x$-(B)$y$-(C)$z$-(D)$w$-      Formula (1)

In Formula (1), each of A, B, C, and D represents the following repeating unit.

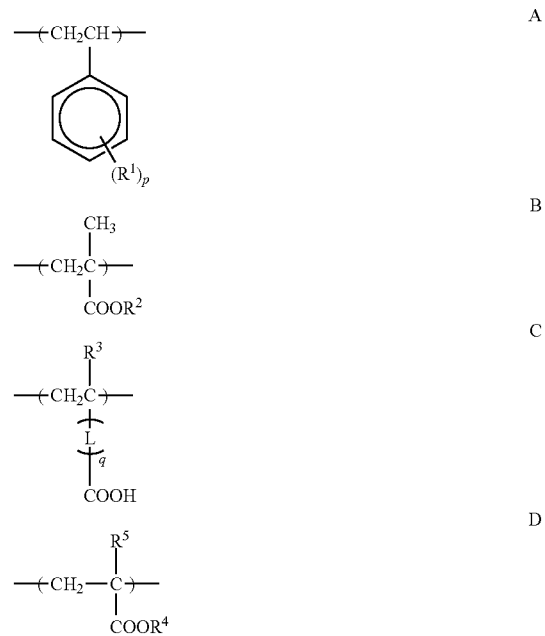

$R^1$ represents a methyl group or a halogen atom, and preferably represents a methyl group, a chlorine atom, or a bromine atom. p represents an integer of 0 to 2. p is preferably 0 or 1, and more preferably 0.

$R^2$ represents a methyl group or an ethyl group, and preferably represents a methyl group.

$R^3$ represents a hydrogen atom or a methyl group, and preferably represents a hydrogen atom. L represents a divalent linking group. L is preferably a group represented by the following Formula (2).

$$—(CO—X^1)_r\text{-}X^2—\qquad\text{Formula (2)}$$

In the formula, $X^1$ represents an oxygen atom or $—NR^{30}—$. Herein, $R^{30}$ represents a hydrogen atom, an alkyl group, an aryl group, or an acyl group, and each of these may have a substituent (for example, a halogen atom, a nitro group, a hydroxyl group, or the like). $R^{30}$ is preferably a hydrogen atom, an alkyl group having 1 to 10 carbon atoms (for example, a methyl group, an ethyl group, a n-butyl group, a n-octyl group, or the like), or an acyl group (for example, an acetyl group, a benzoyl group, or the like). $X^1$ is particularly preferably an oxygen atom or —NH—.

$X^2$ represents an alkylene group, an arylene group, an alkylene arylene group, an arylene alkylene group, or an alkylene arylene alkylene group. —O—, —S—, —OCO—, —CO—, —COO—, —NH—, —SO$_2$—, —N($R^{31}$)—, —N($R^{31}$)SO$_2$—, or the like may be inserted into the aforementioned groups. Herein, $R^{31}$ represents a linear or branched alkyl group having 1 to 6 carbon atoms, which includes a methyl group, an ethyl group, an isopropyl group, and the like. Preferable examples of $X^2$ include a dimethylene group, a trimethylene group, a tetramethylene group, an o-phenylene group, a m-phenylene group, a p-phenylene group, —CH$_2$CH$_2$OCOCH$_2$CH$_2$—, —CH$_2$CH$_2$OCO(C$_6$H$_4$)—, and the like.

r represents 0 or 1.

q represents 0 or 1, and preferably represents 0.

$R^4$ represents an alkyl group having 5 to 80 carbon atoms, an alkenyl group, or an alkynyl group. $R^4$ is preferably an alkyl group having 5 to 50 carbon atoms, more preferably an alkyl group having 5 to 30 carbon atoms, and even more preferably an alkyl group having 5 to 20 carbon atoms.

$R^5$ represents a hydrogen atom, a methyl group, an ethyl group, a halogen atom, or —CH$_2$COOR$^6$. $R^5$ is preferably a hydrogen atom, a methyl group, a halogen atom, or —CH$_2$COOR$^6$, more preferably a hydrogen atom, a methyl group, or —CH$_2$COOR$^6$, and particularly preferably a hydrogen atom.

$R^6$ represents a hydrogen atom or an alkyl group having 1 to 80 carbon atoms, and may be the same as or different from $R^4$. The number of carbon atoms of $R^6$ is preferably 1 to 70, and more preferably 1 to 60.

In Formula (1), each of x, y, z, and w represents a molar ratio of each of the repeating units.

x represents 3 mol % to 60 mol %, preferably represents 3 mol % to 50 mol %, and more preferably represents 3 mol % to 40 mol %.

y represents 30 mol % to 96 mol %, preferably represents 35 mol % to 95 mol %, and particularly preferably represents 40 mol % to 90 mol %.

If z is too small, the affinity with hydrophilic protective colloid such as gelatin is reduced, and consequently, a matting agent is highly likely to be aggregated and peeled off. If z is too great, the matting agent of the present invention dissolves in an alkaline treatment solution for a photosensitive material. Therefore, z represents 0.5 mol % to 25 mol %, preferably represents 0.5 mol % to 20 mol %, and particularly preferably represents 1 mol % to 20 mol %.

w represents 0.5 mol % to 40 mol %, and preferably represents 0.5 mol % to 30 mol %.

It is particularly preferable that, in Formula (1), x represents 3 mol % to 40 mol %, y represents 40 mol % to 90 mol %, z represents 0.5 mol % to 20 mol %, and w represents 0.5 mol % to 10 mol %.

As the polymer represented by Formula (1), a polymer represented by the following Formula (4) is preferable.

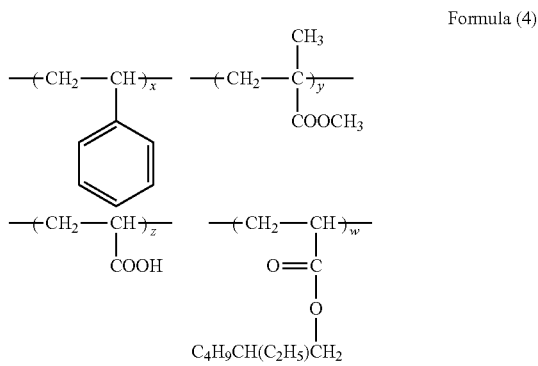

Formula (4)

In Formula (4), x, y, z, and w have the same definition as described above.

The polymer represented by Formula (1) may contain other repeating units in addition to Formulae (A), (B), (C), and (D). Examples of monomers for forming other repeating units include acrylic acid esters, methacrylic acid esters, vinyl esters, olefins, crotonic acid esters, itaconic acid diesters, maleic acid diesters, fumaric acid diesters, acrylamides, unsaturated carboxylic acids, an allyl compound, vinyl ethers, vinyl ketones, a vinyl heterocyclic compound, glycidyl esters, unsaturated nitriles, and the like. These monomers are also described in paragraphs [0010] to [0022] of JP 3754745 B.

From the viewpoint of hydrophobicity, acrylic acid esters and methacrylic acid esters are preferable, and hydroxyalkyl methacrylate such as hydroxyethyl methacrylate or hydroxyalkyl acrylate is more preferable. The polymer represented by Formula (1) preferably contains a repeating unit represented by the following Formula (E) in addition to Formulae (A), (B), (C), and (D).

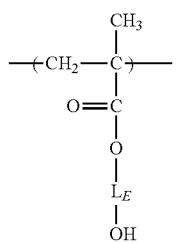

E

In the formula, $L_E$ represents an alkylene group. $L_E$ is preferably an alkylene group having 1 to 10 carbon atoms, more preferably an alkylene group having 2 to 6 carbon atoms, and even more preferably an alkylene group having 2 to 4 carbon atoms.

The polymer represented by Formula (1) is particularly preferably a polymer represented by the following Formula (3).

Formula (3)

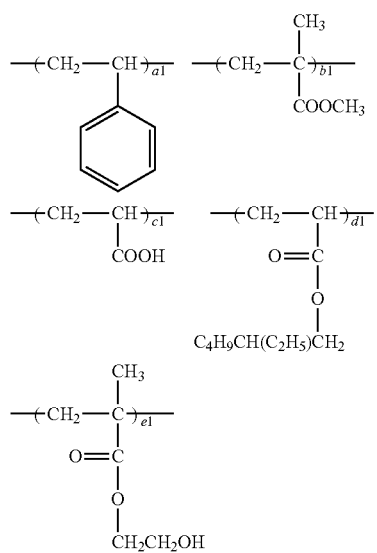

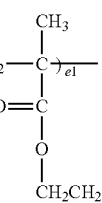

In the formula, each of a1, b1, c1, d1, and e1 represents a molar ratio of each monomer unit. a1 represents 3 (mol %) to 60 (mol %), b1 represents 30 (mol %) to 95 (mol %), c1 represents 0.5 (mol %) to 25 (mol %), d1 represents 0.5 (mol %) to 40 (mol %), and e1 represents 1 (mol %) to 10 (mol %).

The preferable range of a1 is the same as the preferable range of x, the preferable range of b1 is the same as the preferable range of y, the preferable range of c1 is the same as the preferable range of z, and the preferable range of d1 is the same as the preferable range of w.

e1 represents 1 mol % to 10 mol %, preferably represents 2 mol % to 9 mol %, and more preferably represents 2 mol % to 8 mol %.

Specific examples of the polymer represented by Formula (1) will be shown below, but the polymer is not limited to the examples.

(P-1)

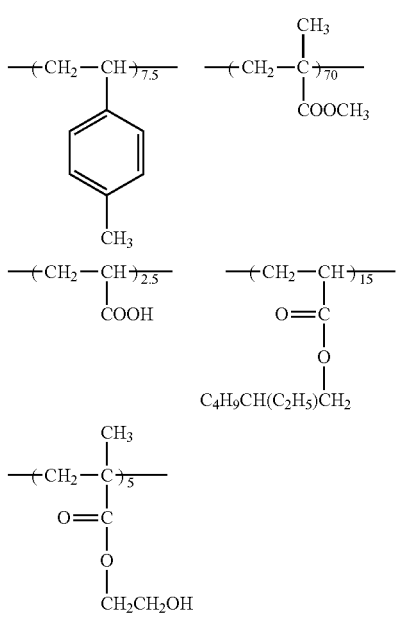

(P-2)

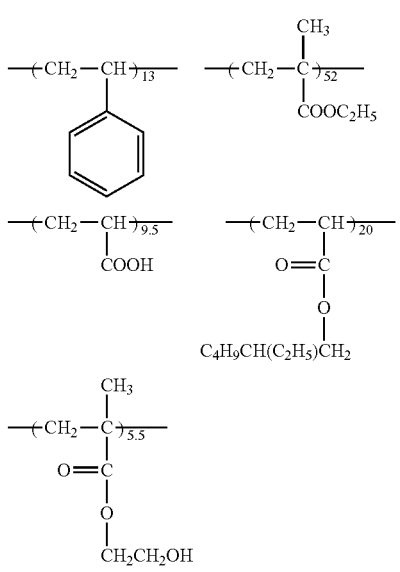

(P-3)

(P-4)

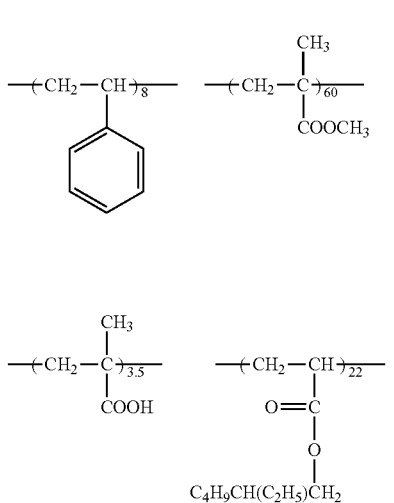

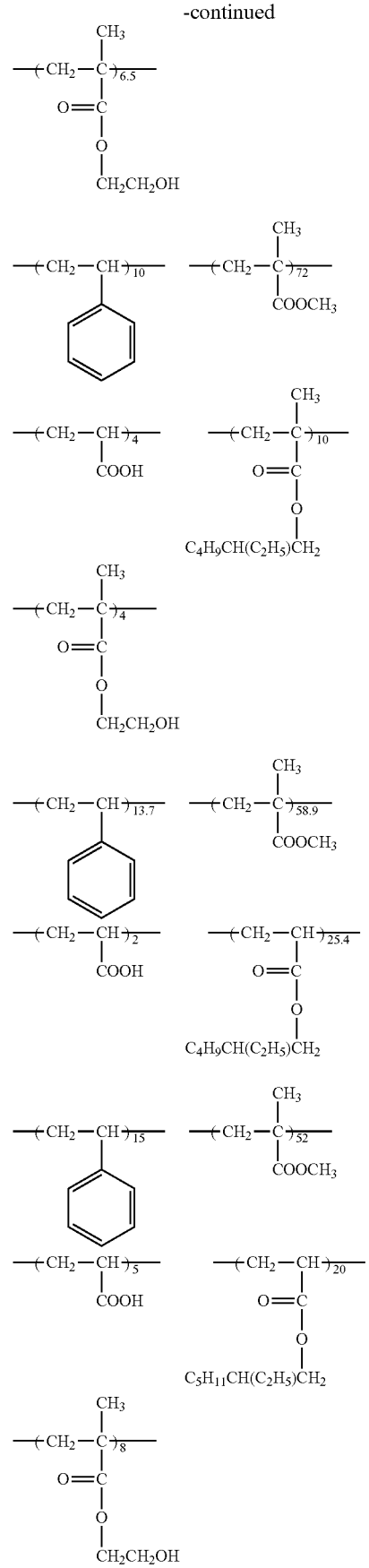
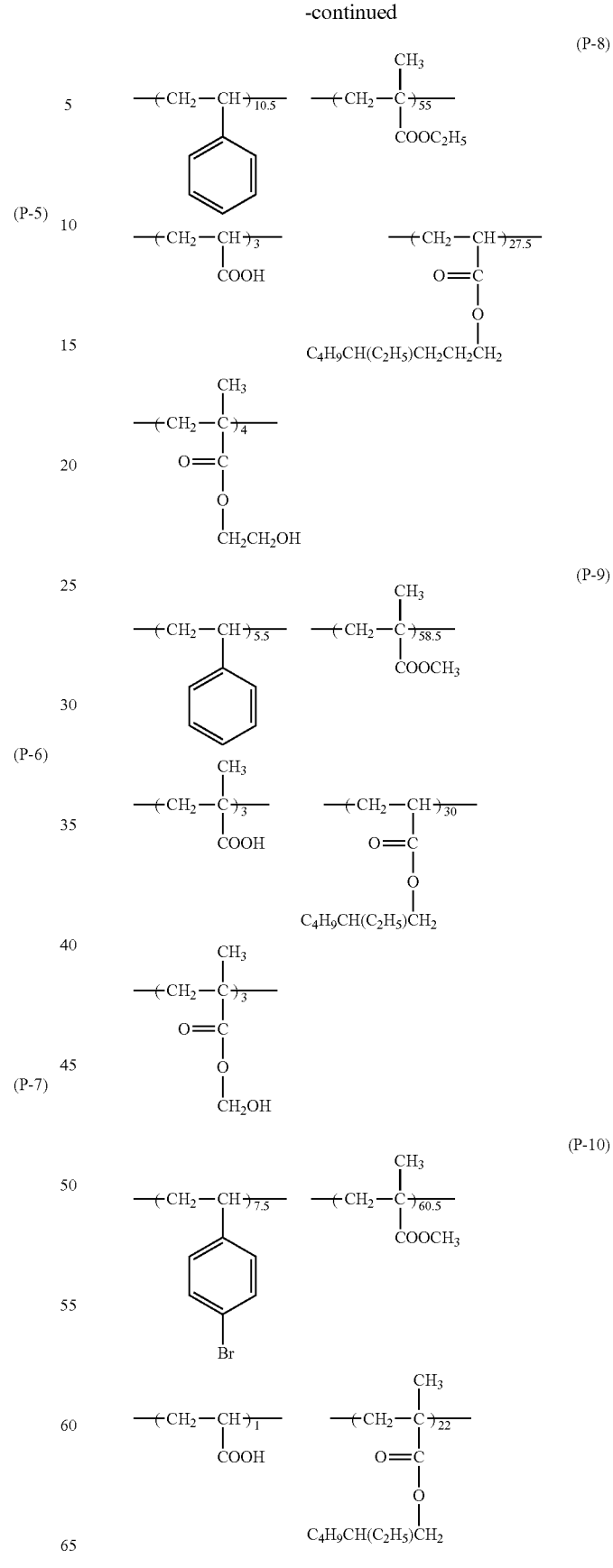

-continued

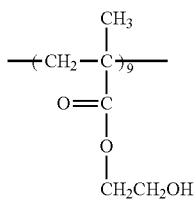

The weight average molecular weight of the polymer represented by Formula (1) is preferably 1,000 to 1,000,000, more preferably 2,000 to 750,000, and even more preferably 3,000 to 500,000.

The polymer represented by Formula (1) can be synthesized with reference to, for example, JP 3305459 B, JP 3754745 B, and the like.

The volume ratio of the metal to the binder (volume of metal/volume of binder) in the thin conductive wires 34 is preferably equal to or greater than 1.0, and more preferably equal to or greater than 1.5. If the volume ratio of the metal to the binder is equal to or greater than 1.0, the conductivity of the thin conductive wires 34 can be further improved. The upper limit of the volume ratio is not particularly limited. However, from the viewpoint of productivity, the upper limit is preferably equal to or less than 6.0, more preferably equal to or less than 4.0, and even more preferably equal to or less than 2.5.

The volume ratio of the metal to the binder can be calculated from the density of the metal and the binder contained in the thin conductive wires 34. For example, when the metal is silver, and the binder is gelatin, the volume ratio can be calculated under the conditions of the density of silver at 10.5 g/cm$^3$ and the density of gelatin at 1.34 g/cm$^3$.

The line width of the thin conductive wires 34 is not particularly limited. However, because electrodes having low resistance can be relatively easily formed, the upper limit of the line width is preferably equal to or less than 30 μm, more preferably equal to or less than 15 μm, even more preferably equal to or less than 10 μm, particularly preferably equal to or less than 9 μm, and most preferably equal to or less than 7 μm, and the lower limit thereof is preferably equal to or greater than 0.5 μm, and more preferably equal to or greater than 1.0 μm.

The thickness of the thin conductive wires 34 is not particularly limited. However, from the viewpoint of conductivity and visibility, the thickness can be selected within a range of 0.00001 mm to 0.2 mm. The thickness is preferably equal to or less than 30 μm, more preferably equal to or less than 20 μm, even more preferably 0.01 μm to 9 μm, and most preferably 0.05 μm to 5 μm.

Each of the lattices 36 includes an opening region surrounded by the thin conductive wires 34. A length W of one side of each of the lattices 36 is preferably equal to or less than 800 μm, and more preferably equal to or less than 600 μm. The length W is preferably equal to or greater than 400 μm.

In view of visible light transmittance, the opening ratio in the first detection electrodes 24 and the second detection electrodes 28 is preferably equal to or greater than 85%, more preferably equal to or greater than 90%, and most preferably equal to or greater than 95%. The opening ratio corresponds to a proportion of a transmitting portion, excluding the thin conductive wires 34 in the first detection electrodes 24 or the second detection electrodes 28 within a predetermined region, in the entire region.

The lattices 36 have the shape of approximately a rhombus. However, the lattices 36 may also have the shape of a polygon (for example, a triangle, a quadrangle, a hexagon, or a random polygon). Moreover, one side of each of the lattices may be in the form of a curved line or an arc in addition to the form of a straight line. When one side of each of the lattices is in the form of an arc, for example, two sides facing each other may be in the form of arcs curving toward the outside, and the other two sides facing each other may be in the form of arcs curving toward the inside. Furthermore, each side of the lattices may be in the form of a wavy line in which an arc curving toward the outside and an arc curving toward the inside continue. Needless to say, each side of the lattices may form a sine curve.

In FIG. 8, the thin conductive wires 34 are formed as mesh patterns. However, the thin conductive wires 34 are not limited to such an embodiment, and may be stripe patterns.

Each of the first lead-out wiring 26 and the second lead-out wiring 30 is a member that plays a role of applying voltage to the first detection electrodes 24 and the second detection electrodes 28.

The first lead-out wiring 26 is disposed on the substrate 22 in the outside region $E_O$. One end of the first lead-out wiring 26 is electrically connected to a corresponding first detection electrode 24, and the other end thereof is electrically connected to the flexible printed wiring board 32.

The second lead-out wiring 30 is disposed on the substrate 22 in the outside region $E_O$. One end of the second lead-out wiring 30 is electrically connected to a corresponding second detection electrode 28, and the other end thereof is electrically connected to the flexible printed wiring board 32.

In FIG. 6, five strands of the first lead-out wiring 26 and five strands of the second lead-out wiring 30 are illustrated. However, the number of the wiring is not particularly limited, and generally, a plurality of strands of wiring is disposed according to the number of the detection electrodes.

Examples of the material constituting the first lead-out wiring 26 and the second lead-out wiring 30 include a metal such as gold (Au), silver (Ag), or copper (Cu), a metal oxide such as tin oxide, zinc oxide, cadmium oxide, gallium oxide, or titanium oxide, and the like. Among these, silver is preferable since it is excellent in conductivity. Furthermore, the wiring may be constituted with metal paste such as silver paste or copper paste, a thin film of a metal such as aluminum (Al) or molybdenum (Mo), or a thin film of an alloy. In the case of the metal paste, a screen printing method or an ink jet printing method is preferably used. In the case of the thin film of a metal or the thin film of an alloy, a sputtered film is preferably patterned by a patterning method such as a photolithography method.

In view of further improving the adhesiveness with respect to the substrate 22, the first lead-out wiring 26 and the second lead-out wiring 30 preferably contain a binder. The type of the binder is as described above.

The flexible printed wiring board 32 is a plate in which a plurality of strands of wiring and terminals are provided on a substrate. The flexible printed wiring board 32 is connected to the other end of each of the first lead-out wiring 26 and to the other end of each of the second lead-out wiring 30, and plays a role of connecting the capacitance-type touch panel sensor 180 to an external apparatus (for example, a display apparatus).

(Method for Manufacturing Capacitance-Type Touch Panel Sensor)

The method for manufacturing the capacitance-type touch panel sensor 180 is not particularly limited, and known methods can be adopted. For example, a method can be adopted in which a resist pattern is formed by performing an exposure and development treatment on a photoresist film on metal foil formed on both of the main surfaces of the substrate 22; and the metal foil exposed through the resist pattern is etched.

Alternatively, a method can be adopted in which paste containing fine metal particles or metal nanowires may be printed on both of the main surfaces of the substrate 22; and the paste is plated with a metal. Moreover, a method can be adopted in which the capacitance-type touch panel sensor 180 is formed on the substrate 22 by means of printing using a screen printing plate or a gravure printing plate. In addition, a method can be adopted in which the capacitance-type touch panel sensor 180 is formed by an ink jet.

Furthermore, in addition to the aforementioned methods, a method of using silver halide can be adopted. More specifically, a method can be adopted which includes a step (1) of forming a silver halide emulsion layer (hereinafter, also simply referred to as a "photosensitive layer") containing silver halide and a binder on both surfaces of the substrate 22 and a step (2) of exposing the photosensitive layer to light and then performing development treatment on the photosensitive layer.

Hereinafter, each of the steps will be described.

[Step (1): Photosensitive Layer Forming Step]

The step (1) is a step of forming a photosensitive layer containing silver halide and a binder on both surfaces of the substrate 22.

The method for forming the photosensitive layer is not particularly limited. However, in view of productivity, it is preferable to use a method of forming the photosensitive layer on both surfaces of the substrate 22 by means of bringing a composition for forming a photosensitive layer, which contains silver halide and a binder, into contact with the substrate 22.

Hereinafter, embodiments of the composition for forming a photosensitive layer that is used in the aforementioned method will be specifically described, and then the procedure of the step will be specifically described.

The composition for forming a photosensitive layer contains silver halide and a binder.

The halogen element contained in the silver halide may be any of chlorine, bromine, iodine, and fluorine, and these may be used in combination. As the silver halide, for example, silver halide which contains silver chloride, silver bromide, or silver iodide as a main component is preferably used, and silver halide which contains silver bromide or silver chloride as a main component is more preferably used.

The type of the binder used is as described above. Furthermore, the binder may be contained in the composition for forming a photosensitive layer, in the form of latex.

The volume ratio of the silver halide to the binder contained in the composition for forming a photosensitive layer is not particularly limited, and is appropriately adjusted so as to fall within the aforementioned preferable range of the volume ratio of the metal to the binder in the thin conductive wires 34.

If necessary, the composition for forming a photosensitive layer contains a solvent.

Examples of the solvent used include water, organic solvents (for example, alcohols such as methanol, ketones such as acetone, amides such as formamide, sulfoxides such as dimethyl sulfoxide, esters such as ethyl acetate, and ethers), ionic liquids, and mixed solvents composed of these.

The content of the solvent used is not particularly limited. However, it is preferably within a range of 30% by mass to 90% by mass, and more preferably within a range of 50% by mass to 80% by mass, with respect to the total mass of the silver halide and the binder.

(Procedure of Step)

The method for bringing the composition for forming a photosensitive layer into contact with the substrate 22 is not particularly limited, and a known method can be adopted. For example, it is possible to adopt a method of coating the substrate 22 with the composition for forming a photosensitive layer, a method of dipping the substrate 22 into the composition for forming a photosensitive layer, and the like.

The content of the binder in the formed photosensitive layer is not particularly limited. However, the content of the binder is preferably 0.3 $g/m^2$ to 5.0 $g/m^2$, and more preferably 0.5 $g/m^2$ to 2.0 $g/m^2$.

The content of the silver halide in the photosensitive layer is not particularly limited. However, in view of further improving the conductivity of the thin conductive wires 34, the content of the silver halide is preferably 1.0 $g/m^2$ to 20.0 $g/m^2$, and more preferably 5.0 $g/m^2$ to 15.0 $g/m^2$ expressed in terms of silver.

If necessary, a protective layer composed of the binder may be additionally provided on the photosensitive layer. If the protective layer is provided, scratches are prevented, or dynamic characteristics are improved.

[Step (2): Exposure and Development Step]

The step (2) is a step of pattern-wise exposing the photosensitive layer obtained in the step (1) to light and performing development treatment on the photosensitive layer such that the first detection electrodes 24, the first lead-out wiring 26, the second detection electrodes 28, and the second lead-out wiring 30 are formed.

Hereinafter, first, the pattern exposure treatment will be specifically described, and then the development treatment will be specifically described.

(Pattern Exposure)

When the photosensitive layer is pattern-wise exposed to light, in the exposed region, the silver halide in the photosensitive layer forms a latent image. In the region in which the latent image is formed, thin conductive wires are formed by the development treatment, which will be described later. In contrast, in the unexposed region that is not exposed to light, the silver halide dissolves and flows out of the photosensitive layer at the time of the fixing treatment, which will be described later, and thus a transparent film is obtained.

The light source used for exposure is not particularly limited, and examples thereof include light such as visible rays and ultraviolet rays, radiation such as X-rays, and the like.

The method for performing the pattern exposure is not particularly limited. For example, the pattern exposure may be performed by double-sided exposure using a photomask or scanning exposure using laser beams. Herein, the form of the pattern is not particularly limited and appropriately adjusted according to the intended pattern of the thin conductive wires to be formed.

(Development Treatment)

The method of development treatment is not particularly limited, and known methods can be adopted. For example, it is possible to use general technologies of the development treatment used for silver halide photographic films, photographic printing paper, films for making printing plates, emulsion masks for photomasks, and the like.

The type of the developer used at the time of development treatment is not particularly limited, and for example, it is possible to use a PQ developer, an MQ developer, an MAA developer, and the like. As commercially available products, for example, it is possible to use developers such as CN-16, CR-56, CP45X, FD-3, and Papitol formulated by FUJIFILM Corporation, C-41, E-6, RA-4, D-19, and D-72 formulated by KODAK, and developers included in the kit thereof. Furthermore, it is possible to use a lithographic developer.

The development treatment can include fixing treatment performed for stabilization by removing silver halide in an unexposed portion. For the fixing treatment, it is possible to use technologies of the fixing treatment used for silver halide photographic films, photographic printing paper, films for making printing plates, emulsion masks for photomasks, and the like.

In the fixing treatment, the fixing temperature is preferably about 20° C. to about 50° C., and more preferably 25° C. to 45° C. The fixing time is preferably 5 seconds to 1 minute, and more preferably 7 seconds to 50 seconds.

The mass of metal silver contained in the exposed portion having undergone the development treatment (thin conductive wires) is preferably equal to or greater than 50% by mass, and more preferably equal to or greater than 80% by mass, with respect to the mass of silver contained in the exposed portion having not yet been exposed to light. If the mass of silver contained in the exposed portion is equal to or greater than 50% by mass with respect to the mass of silver contained in the exposed portion having not yet been exposed to light, it is preferable because a high degree of conductivity can be obtained.

If necessary, in addition to the aforementioned steps, the following undercoat layer forming step, anti-halation layer forming step, or heating treatment may be performed.

(Undercoat Layer Forming Step)

Because the adhesiveness between the substrate 22 and the silver halide emulsion layer becomes excellent, it is preferable to perform a step of forming a binder-containing undercoat layer on both surfaces of the substrate 22 before the step (1).

The binder used in this step is as described above. The thickness of the undercoat layer is not particularly limited. However, because the adhesiveness is further improved, and the rate of change in mutual capacitance is further reduced, the thickness thereof is preferably 0.01 µm to 0.5 µm, and more preferably 0.01 µm to 0.1 µm.

(Anti-Halation Layer Forming Step)

From the viewpoint of making thinner conductive wires 34, it is preferable to perform a step of forming an anti-halation layer on both surfaces of the substrate 22 before the step (1).

(Step (3): Heating Step)

Step (3) which is performed if necessary is a step of performing heating treatment after the development treatment. By performing this step, the binders are fused with each other, and the hardness of the thin conductive wires 34 is further increased. Particularly, when polymer particles are dispersed as the binder in the composition for forming a photosensitive layer (when the binder is a polymer particle in latex), by performing this step, the polymer particles are fused with each other, and thin conductive wires 34 exhibiting intended hardness are formed.

The conditions of the heating treatment are appropriately selected according to the binder used. However, from the viewpoint of the temperature at which the polymer particles form a film, the heating treatment is preferably performed at a temperature of equal to or higher than 40° C., more preferably performed at a temperature of equal to or higher than 50° C., and even more preferably performed at a temperature of equal to or higher than 60° C. Furthermore, from the viewpoint of inhibiting curling or the like of the substrate, the heating treatment is preferably performed at a temperature of equal to or less than 150° C., and more preferably performed at a temperature of equal to or less than 100° C.

The heating time is not particularly limited. However, from the viewpoint of inhibiting curling or the like of the substrate and from the viewpoint of productivity, the heating time is preferably 1 minute to 5 minutes, and more preferably 1 minute to 3 minutes.

Generally, the heating treatment can also function as a drying step that is performed after the exposure and development treatment. Therefore, a new step does not need to be additionally performed for forming a film of polymer particles, and as a result, it is excellent in view of productivity, cost, and the like.

By performing the aforementioned step, a binder-containing light transmitting portion is formed between the thin conductive wires 34. The transmittance in the light transmitting portion that is expressed as the minimum transmittance in a region of a wavelength of 380 nm to 780 nm is preferably equal to or greater than 90%, more preferably equal to or greater than 95%, even more preferably equal to or greater than 97%, particularly preferably equal to or greater than 98%, and most preferably equal to or greater than 99%.

The light transmitting portion may contain materials other than the binder, and examples of the materials include a poor solvent for silver and the like.

The embodiment of the capacitance-type touch panel sensor is not limited to the aforementioned embodiment shown in FIG. 6, and other embodiments may be employed.

Figure 9:
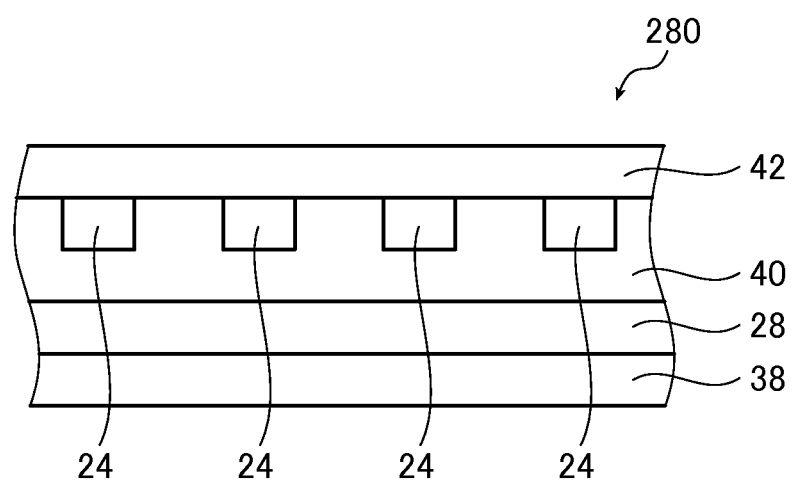
FIG. 9 is a cross-sectional view of a part of another embodiment of the capacitance-type touch panel sensor.

For example, as shown in FIG. 9, a capacitance-type touch panel sensor 280 includes a first substrate 38, the second detection electrodes 28 disposed on the first substrate 38, second lead-out wiring (not shown in the drawing) which is electrically connected to one end of the second detection electrodes 28 and disposed on the first substrate 38, an adhesive sheet 40, the first detection electrodes 24, first lead-out wiring (not shown in the drawing) which is electrically connected to one end of the first detection electrodes 24, a second substrate 42 to which the first detection electrodes 24 and the first lead-out wiring are adjacent, and a flexible printed wiring board (not shown in the drawing).

As shown in FIG. 9, the capacitance-type touch panel sensor 280 has the same constitution as the capacitance-type touch panel sensor 180 except for the first substrate 38, the second substrate 42, and the adhesive sheet 40. Therefore, the same constituents are marked with the same reference numerals so as not to repeat the description thereof.

The definition of the first substrate 38 and the second substrate 42 is the same as the definition of the aforementioned substrate 22.

The adhesive sheet 40 is a layer for bringing the first detection electrodes 24 into close contact with the second detection electrodes 28. The adhesive sheet 40 is preferably optically transparent (the adhesive sheet 40 is preferably a transparent adhesive sheet). As the material constituting the adhesive sheet 40, a known material is used. Furthermore, as the adhesive sheet 40, the aforementioned adhesive sheet 12 may be used.

The first detection electrodes 24 and the second detection electrodes 28 in FIG. 9 are used in plural numbers as shown in FIG. 6, and disposed such that the first detection electrodes 24 are orthogonal to the second detection electrodes 28 as shown in FIG. 6.

The capacitance-type touch panel sensor 280 shown in FIG. 9 corresponds to a capacitance-type touch panel sensor obtained by preparing two sheets of substrates with electrodes, each of which is composed of a substrate and detection electrodes plus lead-out wiring that are disposed on the surface of the substrate, and bonding the two sheets of substrates to each other through an adhesive sheet such that the electrodes face each other.

Figure 10:
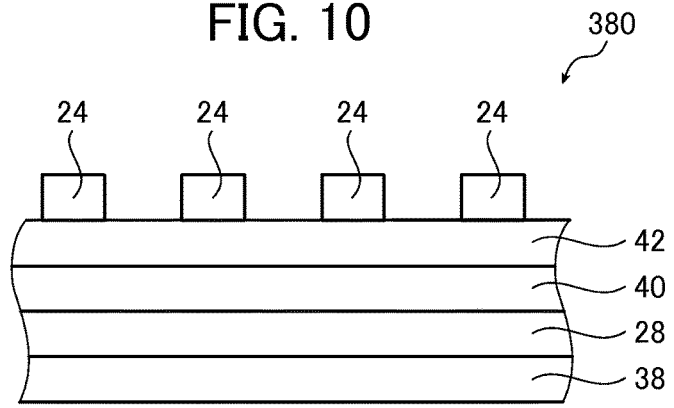
FIG. 10 is a cross-sectional view of a part of another embodiment of the capacitance-type touch panel sensor.

As another embodiment of the capacitance-type touch panel sensor, for example, the embodiment shown in FIG. 10 can be employed.

A capacitance-type touch panel sensor 380 includes the first substrate 38, the second detection electrodes 28 disposed on the first substrate 38, second lead-out wiring (not shown in the drawing) which is electrically connected to one end of the second detection electrodes 28 and disposed on the first substrate 38, the adhesive sheet 40, the second substrate 42, the first detection electrodes 24 disposed on the second substrate 42, first lead-out wiring (not shown in the drawing) which is electrically connected to one end of the first detection electrodes 24 and disposed on the second substrate 42, and a flexible printed wiring board (not shown in the drawing).

The capacitance-type touch panel sensor 380 shown in FIG. 10 has the same layers as the capacitance-type touch panel sensor 280 shown in FIG. 9, except that the order of the respective layers is different. Therefore, the same constituents are marked with the same reference numerals so as not to repeat the description thereof.

The first detection electrodes 24 and the second detection electrodes 28 in FIG. 10 are used in plural numbers as shown in FIG. 6, and are disposed such that the first detection electrodes 24 are orthogonal to the second detection electrodes 28 as shown in FIG. 6.

The capacitance-type touch panel sensor 380 shown in FIG. 10 corresponds to a capacitance-type touch panel sensor obtained by preparing two sheets of substrates with electrodes, each of which is composed of a substrate and detection electrodes plus lead-out wiring that are disposed on the surface of the substrate, and bonding the two sheets of substrates to each other through an adhesive sheet such that one of the substrates with electrodes faces the electrodes of the other substrate with electrodes.

As another embodiment of the capacitance-type touch panel sensor, for example, the thin conductive wires 34 of the first detection electrodes 24 and the second detection electrodes 28 in FIG. 6 may be constituted with metal oxide particles or metal paste such as silver paste or copper paste. Particularly, in view of excellent conductivity and transparency, a conductive film composed of thin silver wires or a silver nanowire conductive film is preferable.

The first detection electrodes 24 and the second detection electrodes 28 have a mesh structure constituted with the thin conductive wires 34. However, the electrodes are not limited to such an embodiment, and for example, they may be formed of a thin film of a metal oxide (transparent thin film of a metal oxide) such as ITO or ZnO, or formed of a transparent conductive film in which a network is constituted with metal nanowires such as silver nanowires or copper nanowires.

Figure 11:
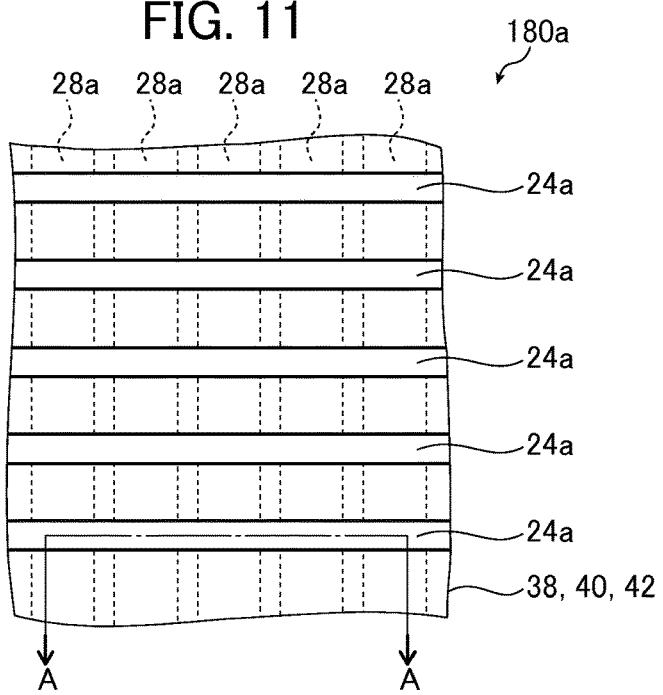
FIG. 11 is a plan view of a part of another embodiment of the capacitance-type touch panel sensor.
Figure 12:
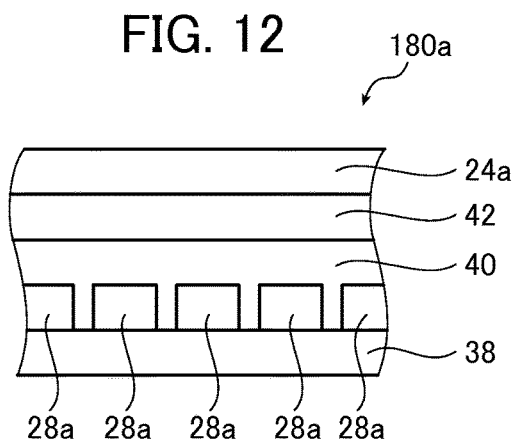
FIG. 12 is a cross-sectional view taken along the cutting line A-A shown in FIG. 11.

More specifically, as shown in FIG. 11, the capacitance-type touch panel sensor may be a capacitance-type touch panel sensor 180a having first detection electrodes 24a and second detection electrodes 28a constituted with a transparent metal oxide. FIG. 11 is a plan view showing a part of the capacitance-type touch panel sensor 180a in an input region. FIG. 12 is a cross-sectional view taken along the cutting line A-A in FIG. 11. The capacitance-type touch panel sensor 180a includes the first substrate 38, the second detection electrodes 28a disposed on the first substrate 38, second lead-out wiring (not shown in the drawing) which is electrically connected to one end of the second detection electrodes 28a and disposed on the first substrate 38, the adhesive sheet 40, the second substrate 42, the first detection electrodes 24a disposed on the second substrate 42, first lead-out wiring (not shown in the drawing) which is electrically connected to one end of the first detection electrodes 24a and disposed on the second substrate 42, and a flexible printed wiring board (not shown in the drawing).

The capacitance-type touch panel sensor 180a shown in FIGS. 11 and 12 has the same layers as the capacitance-type touch panel sensor 380 shown in FIG. 10, except for the first detection electrodes 24a and the second detection electrodes 28a. Therefore, the same constituents are marked with the same reference numerals so as not to repeat the description thereof.

The capacitance-type touch panel sensor 180a shown in FIGS. 11 and 12 corresponds to a capacitance-type touch panel sensor obtained by preparing two sheets of substrates with electrodes, each of which is composed of a substrate and detection electrodes plus lead-out wiring that are disposed on the surface of the substrate, and bonding the two sheets of substrates to each other through an adhesive layer such that one of the substrates with electrodes faces the electrodes of the other substrate with electrodes.

As described above, the first detection electrodes 24a and the second detection electrodes 28a are electrodes that extend in the X-axis direction and the Y-axis direction respectively, and are constituted with a transparent metal oxide such as indium tin oxide (ITO). In FIGS. 11 and 12, in order to make the transparent electrode ITO function as a sensor, the design is employed in which the resistance of the indium tin oxide (ITO) is reduced by decreasing the total resistance of wiring by means of increasing the electrode area, and further, the thickness of the electrode is reduced such that the characteristics as transparent electrodes can be utilized, thereby securing the light transmittance.

Examples of materials other than ITO that can be used in the aforementioned embodiment include zinc oxide (ZnO), indium zinc oxide (IZO), gallium zinc oxide (GZO), aluminum zinc oxide (AZO), and the like.

The patterning method of the electrode portions (the first detection electrodes 24a and the second detection electrodes 28a) can be selected according to the material of the electrode portions. For example, a photolithography method, a resist mask screen printing-etching method, an ink jet method, a printing method, or the like may be used.

(Protective Substrate)

The protective substrate 20 is a substrate disposed on the adhesive sheet, and plays a role of protecting the capacitance-type touch panel sensor 18, which will be described later, from the external environment. The main surface of the protective substrate 20 constitutes a touch screen.

The protective substrate 20 is preferably a transparent substrate, and as the protective substrate 20, it is possible to use a plastic film, a plastic plate, a glass plate, or the like. The thickness of the substrate is appropriately selected according to the respective purposes.

As the raw material of the aforementioned plastic film and plastic plate, for example, it is possible to use polyesters such as polyethylene terephthalate (PET) and polyethylene naphthalate (PEN); polyolefins such as polyethylene (PE), polypropylene (PP), polystyrene, and EVA; a vinyl-based resin; and others such as polycarbonate (PC), polyamide, polyimide, an acrylic resin, triacetyl cellulose (TAC), a cycloolefin-based resin (COP), and the like.

Furthermore, as the protective substrate 20, a polarizing plate, a circularly polarizing plate, and the like may be used.

(Display Apparatus)

The display apparatus 50 is an apparatus having a display screen that displays an image, and the respective members are disposed on the side of the display screen.

The type of the display apparatus 50 is not particularly limited, and a known display apparatus can be used. Examples thereof include a cathode ray tube (CRT) display apparatus, a liquid crystal display (LCD) apparatus, an organic light emitting diode (OLED) display apparatus, a vacuum fluorescent display (VFD), a plasma display panel (PDP), a surface-conduction electron-emitter display (SED), a field emission display (FED), electronic paper (E-Paper), and the like.

The aforementioned adhesive sheet can be preferably used for manufacturing a capacitance-type touch panel. For example, the adhesive sheet is used for providing an adhesive sheet disposed between the display apparatus and the aforementioned capacitance-type touch panel sensor, between the aforementioned capacitance-type touch panel sensor and the protective substrate, or between the substrate in the capacitance-type touch panel sensor and the conductive films which are disposed on the substrate and include the detection electrodes.

Particularly, the adhesive sheet of the present invention is preferably used for providing an adhesive layer adjacent to the detection electrodes in the capacitance-type touch panel. If the adhesive sheet is used in such an embodiment, it is preferable because the touch-related malfunctioning caused by the influence of the aforementioned variable factors can be markedly reduced.

For example, when the detection electrodes are disposed on the rear and front surfaces of the substrate of the capacitance-type touch panel sensor, if the adhesive sheet is disposed to come into contact with the detection electrodes on both of the surfaces, the adhesive sheet becomes adjacent to the detection electrodes as described above. Furthermore, when the capacitance-type touch panel sensor is composed of two sheets of conductive films, each of which includes a substrate and detection electrodes disposed on one surface of the substrate, and the two sheets of conductive films are bonded to each other, if the adhesive sheet is disposed to come into contact with the detection electrodes, the adhesive sheet becomes adjacent to the detection electrodes as described above. More specifically, the adhesive sheet becomes adjacent to the detection electrodes as described above when the adhesive sheet is used as in the embodiments of the adhesive layer 40 shown in FIGS. 9 and 10.

The interface of electronic devices is progressing to the age of more intuitive touch sensing from a graphical user interface, and the usage environment of mobile devices other than mobile phones also keeps advancing. The use of the mobile devices equipped with a capacitance-type touch panel is being diversified from a small-sized smart phone to a middle-sized tablet PC, laptop computer, or the like, and the recent trend strongly requires the increase of the screen size used.

As the size of the input region, which can detect the contact state with an object, of the capacitance-type touch panel sensor is increased in a diagonal direction, the number of operation wires (the number of detection electrodes) is also increased, and therefore the time taken for scanning per wire needs to be shortened. In order to maintain a sensing environment appropriate for using mobile devices, the parasitic capacitance of the capacitance-type touch sensor and the amount of temperature change thereof should be decreased. In the conventional adhesive layer, the temperature dependence of a relative dielectric constant is high, and if the size of the input region is increased, the sensing program may not be able to keep up with the increase (malfunctioning may occur). In contrast, in the aforementioned adhesive layer, the temperature dependence of a relative dielectric constant is low, and if the adhesive layer is used, when the size of the input region (sensing portion), which can detect the contact state with an object, of the capacitance-type touch panel sensor is greater than 5 inches in a diagonal direction, a more appropriate sensing environment is obtained. More preferably, when the size of the input region is equal to or greater than 8 inches, and even more preferably, when the size of the input region is equal to or greater than 10 inches, the adhesive layer can exhibit a strong effect of suppressing the malfunctioning. Herein, the input region having the aforementioned size has a rectangular shape.

In addition, generally, as the input region of the capacitance-type touch panel sensor is enlarged, the size of the display screen of the display apparatus is also increased.

EXAMPLES

Hereinafter, the present invention will be more specifically described based on examples, but the present invention is not limited thereto.

Synthesis Example 1

A solution S-1 was manufactured by mixing the following components together.

| | |
|---|---|
| Clearon P-85 (manufactured by YASUHARA CHEMICAL CO., LTD.) | 23 parts by mass |
| Polybest 110 (manufactured by Evonik Degussa GmbH) | 31 parts by mass |
| Fancryl FA-512M (manufactured by Hitachi Chemical Co., Ltd.) | 15 parts by mass |
| Lightester HOB(N) (manufactured by KYOEISHA CHEMICAL Co., Ltd.) | 4 parts by mass |
| Lightester IB-X (manufactured by KYOEISHA CHEMICAL Co., Ltd.) | 3 parts by mass |
| Kuraprene UC-203 (manufactured by KURARAY CO., LTD.) | 21.8 parts by mass |
| IRGACURE 184 (manufactured by BASF Corporation) | 2.3 parts by mass |
| LUCIRIN TPO (manufactured by BASF Corporation) | 0.7 parts by mass |

A PET release film was coated with the obtained solution S-1, and a release surface of a PET release film was bonded onto the coating solution. By using UV light from a high-pressure mercury UV lamp (DEEP UV Lamp UXM-501MD, manufactured by USHIO INC.), a sample sandwiched between the PET release films was irradiated with the UV light at an irradiation energy of 3 J/cm$^2$, thereby manufacturing an adhesive film G-1 in which an adhesive sheet is sandwiched between PET release films.

Synthesis Example 2

An adhesive film G-2 was manufactured according to the same procedure as in Synthesis example 1, except that the amount of Clearon P-85 used was changed to 50 parts by mass, the amount of Polybest 110 used was changed to 5 parts by mass, the amount of Fancryl FA-512M used was changed to 20 parts by mass, and Lightester IB-X and Lightester HOB(N) were not used.

Synthesis Example 3

An adhesive film G-3 was manufactured according to the same procedure as in Synthesis example 1, except that the amount of Clearon P-85 used was changed to 22.7 parts by mass, the amount of Polybest 110 used was changed to 32.6 parts by mass, the amount of Fancryl FA-512M used was changed to 4.8 parts by mass, the amount of Lightester HOB(N) used was changed to 2 parts by mass, the amount of Kuraprene UC-203 used was changed to 23.1 parts by mass, the amount of IRGACURE 184 used was changed to 1.5 parts by mass, the amount of LUCIRIN TPO used was changed to 0.6 parts by mass, and 2.8 parts by mass of Fancryl FA-BZA (manufactured by Hitachi Chemical Co., Ltd.) and 8 parts by mass of acryloylmorpholine (manufactured by Tokyo Chemical Industry Co., Ltd.) were additionally used.

Synthesis Example 4

An adhesive film G-4 was manufactured according to the same procedure as in Synthesis example 1, except that the amount of Clearon P-85 used was changed to 23.8 parts by mass, the amount of Polybest 110 used was changed to 31.7 parts by mass, Fancryl FA-512M (15 parts by mass) was changed to Fancryl FA-513M (19.8 parts by mass, manufactured by Hitachi Chemical Co., Ltd.), the amount of IRGACURE 184 used was changed to 2.4 parts by mass, the amount of LUCIRIN TPO used was changed to 0.6 parts by mass, and Lightester IB-X and Lightester HOB(N) were not used.

Synthesis Example 5

An adhesive film G-5 was manufactured according to the same procedure as in Synthesis example 1, except that Clearon P-85 (23 parts by mass) was changed to Clearon P-135 (38.8 parts by mass, manufactured by YASUHARA CHEMICAL CO., LTD.), the amount of Polybest 110 used was changed to 16.6 parts by mass, the amount of Fancryl FA-512M used was changed to 19.8 parts by mass, the amount of IRGACURE 184 used was changed to 2.4 parts by mass, the amount of LUCIRIN TPO used was changed to 0.6 parts by mass, and Lightester HOB(N) and Lightester IB-X were not used.

Synthesis Example 6

An adhesive film G-6 was manufactured according to the same procedure as in Synthesis example 1, except that the amount of Polybest 110 used was changed to 32 parts by mass, the amount of Lightester IB-X used was changed to 20 parts by mass, and Fancryl FA-512M and Lightester HOB (N) were not used.

Synthesis Example 7

An adhesive film G-8 was manufactured according to the same procedure as in Synthesis example 1, except that a solution, which was obtained by mixing Light acrylate L-A (31 parts by mass, manufactured by KYOEISHA CHEMICAL Co., Ltd.), butyl acrylate (67 parts by mass, manufactured by Tokyo Chemical Industry Co., Ltd.), and IRGACURE 184 (2 parts by mass) together, was used instead of the solution S-1 of Synthesis example 1.

As an adhesive film G-7 used in comparative examples which will be described later, a highly transparent adhesive transfer tape 8146-2 (manufactured by 3M) was used. Herein, the adhesive film G-7 was used after a release film was peeled off.

Synthesis Example 8

An adhesive film G-9 was obtained according to the same procedure as in Synthesis example 1, except that the amount of Polybest 110 was changed to 33 parts by mass, the amount of Fancryl FA-512M was changed to 6 parts by mass, the amount of Kuraprene UC-203 was changed to 23 parts by mass, the amount of IRGACURE 184 was changed to 1.6 parts by mass, the amount of LUCIRIN TPO was changed to 0.6 parts by mass, 6 parts by mass of Fancryl FA-BZA (manufactured by Hitachi Chemical Co., Ltd.), 2 parts by mass of acryloylmorpholine (manufactured by Tokyo Chemical Industry Co., Ltd.), and 2 parts by mass of Lightester L (manufactured by KYOEISHA CHEMICAL Co., Ltd.) were additionally used, and Lightester HOB(N) was not used.

Examples 1 to 9, and Comparative Examples 1 to 6

<A> Method for Manufacturing Silver Mesh Wiring (Preparation of Silver Halide Emulsion)

To the following Liquid 1 kept at 38° C. and pH 4.5, 90% of the following Liquid 2 and Liquid 3 were simultaneously added over 20 minutes while being stirred, thereby forming 0.16 μm of nuclear particles. Subsequently, the following Liquid 4 and Liquid 5 were added thereto over 8 minutes, and then the remaining 10% of the following Liquid 2 and Liquid 3 were added thereto over 2 minutes, such that the particles grew into 0.21 μm of particles. Thereafter, 0.15 g of potassium iodide was added thereto, the particles were allowed to mature for 5 minutes, and then the formation of particles was ended.

| Liquid 1: | |
|---|---|
| Water | 750 ml |
| Gelatin | 9 g |
| Sodium chloride | 3 g |
| 1,3-Dimethylimidazolidine-2-thione | 20 mg |
| Sodium benzene thiosulfonate | 10 mg |
| Citric acid | 0.7 g |
| Liquid 2: | |
| Water | 300 ml |
| Silver nitrate | 150 g |
| Liquid 3: | |
| Water | 300 ml |
| Sodium chloride | 38 g |
| Potassium bromide | 32 g |

-continued

| | |
|---|---|
| Potassium hexachloroiridate (III) (0.005% KCl 20% aqueous solution) | 8 ml |
| Ammonium hexachlororhodate (0.001% NaCl 20% aqueous solution) | 10 ml |
| Liquid 4: | |
| Water | 100 ml |
| Silver nitrate | 50 g |
| Liquid 5: | |
| Water | 100 ml |
| Sodium chloride | 13 g |
| Potassium bromide | 11 g |
| Potassium ferrocyanide | 5 mg |

Thereafter, according to a common method, the resultant was washed with water by a flocculation method. Specifically, the resultant was cooled to 35° C., and the pH thereof was reduced by using sulfuric acid until the silver halide was precipitated (the pH was within a range of 3.6±0.2). Next, about 3 L of supernatant liquid was removed (first washing with water). Subsequently, 3 L of distilled water was added thereto, and then sulfuric acid was added thereto until the silver halide was precipitated. Then 3 L of supernatant liquid was removed again (second washing with water). The same operation as the second washing with water was repeated once (third washing with water), and then the step of washing with water and demineralization was ended. The pH of the emulsion obtained after the washing with water and demineralization was adjusted to 6.4, and the pAg thereof was adjusted to 7.5. Next, by adding 3.9 g of gelatin, 10 mg of sodium benzene thiosulfonate, 3 mg of sodium benzene thiosulfinate, 15 mg of sodium thiosulfate, and 10 mg of chloroauric acid to the emulsion, chemical sensitization was performed on the emulsion such that the emulsion exhibited optimal sensitivity at 55° C. Thereafter, 100 mg of 1,3,3a,7-tetraazaindene as a stabilizer and 100 mg of Proxel (trade name, manufactured by ICI Co., Ltd.) as a preservative were added thereto. The finally obtained emulsion was an emulsion of cubic silver iodochlorobromide particles that contained 0.08 mol % of silver iodide and silver chlorobromide composed of silver chloride and silver bromide at a ratio of 70 mol % and 30 mol %, and had an average particle size of 0.22 μm and a coefficient of variation of 9%.

(Preparation of Composition for Forming Photosensitive Layer)

To the aforementioned emulsion, 1,3,3a,7-tetraazaindene in an amount of $1.2 \times 10^{-4}$ mol/mol Ag, hydroquinone in an amount of $1.2 \times 10^{-2}$ mol/mol Ag, citric acid in an amount of $3.0 \times 10^{-4}$ mol/mol Ag, and 2,4-dichloro-6-hydroxy-1,3,5-triazine sodium salt in an amount of 0.90 g/mol Ag were added. By using citric acid, the pH of the coating liquid was adjusted to be 5.6, thereby obtaining a composition for forming a photosensitive layer.

(Photosensitive Layer Forming Step)

A polyethylene terephthalate (PET) film having a thickness of 100 μm was subjected to corona discharge treatment. Thereafter, on both surfaces of the PET film, a gelatin layer having a thickness of 0.1 μm was provided as an undercoat layer, and on the undercoat layer, an anti-halation layer, which had an optical density of about 1.0 and contained a dye that was bleached by alkali of a developer, was provided. The anti-halation layer was coated with the composition for forming a photosensitive layer, and a gelatin layer having a thickness of 0.15 μm was provided thereon, thereby obtaining a PET film in which a photosensitive layer was formed on both surfaces thereof. The obtained film was named Film A. The formed photosensitive layer contained silver in an amount of 6.0 g/m² and gelatin in an amount of 1.0 g/m².

(Exposure and Development Step)

Through a photomask, in which the detection electrodes (the first detection electrodes and the second detection electrodes) and the lead-out wiring (the first lead-out wiring and the second lead-out wiring) were arranged as shown in FIG. 6, both surfaces of the aforementioned film A were exposed to parallel light from a high-pressure mercury lamp used as a light source. After being exposed to light, the film A was developed with a developer and further subjected to development treatment by using a fixing solution (trade name: N3X-R for CN16X, manufactured by FUJIFILM Corporation). The film A was then rinsed with pure water and dried, thereby obtaining a capacitance-type touch panel sensor A which had detection electrodes and lead-out wiring composed of thin Ag wires on both surfaces thereof.

In the obtained capacitance-type touch panel sensor A, the detection electrodes were constituted with thin conductive wires crossing each other in the form of mesh. Furthermore, as described above, the first detection electrodes were electrodes extending in the X-direction, and the second detection electrodes were electrodes extending in the Y-direction. The first and second detection electrodes were disposed on the film at a pitch of 4.5 mm to 5 mm.

<Capacitance-Type Touch Panel Sensor Having ITO Wiring>

By a known method, a capacitance-type touch panel sensor B shown in FIG. 11 that had detection electrodes constituted with ITO was manufactured.

More specifically, the capacitance-type touch panel sensor B having the ITO detection electrodes was a capacitance-type touch panel sensor shown in the aforementioned FIG. 11 obtained by bonding a first substrate with electrodes, which was composed of the first substrate 38 and the second detection electrodes 28a formed of ITO disposed on the first substrate 38, to a second substrate with electrodes, which was composed of the second substrate 42 and the first detection electrodes 24a formed of ITO disposed on the second substrate 42, through the adhesive layer 40. Herein, the first detection electrodes and the second detection electrodes are orthogonal to each other. Furthermore, each of the first detection electrodes and the second detection electrodes was connected to the lead-out wiring.

Thereafter, by using the adhesive films G-1 to G-9, a touch panel was manufactured which included a liquid crystal display apparatus, a lower adhesive layer, a capacitance-type touch panel sensor, an upper adhesive layer, and a glass substrate in this order. As the capacitance-type touch panel sensor, the capacitance-type touch panel sensor A or the capacitance-type touch panel sensor B manufactured as above was used.

The touch panel was manufactured by the following method. The PET release film on one side of the aforementioned adhesive film was peeled off, and then the adhesive sheet was bonded onto the capacitance-type touch panel sensor by using a roller weighing 2 kg, thereby preparing the upper adhesive layer. Furthermore, the PET release film on the other side of the adhesive film was peeled off, and the glass substrate having the same size as the upper adhesive layer was bonded onto the upper adhesive layer by using the same roller weighing 2 kg. Subsequently, in a high-pressure constant temperature bath, the resultant was subjected to defoaming treatment by being exposed to an environment of 40° C. and 5 atm for 20 minutes.

Thereafter, by using the adhesive sheet used for preparing the upper adhesive layer, and according to the same procedure as used for preparing the upper adhesive layer, the lower adhesive layer was disposed between the capacitance-type touch panel sensor of the structure, which was obtained by bonding the glass substrate, the upper adhesive layer, and the capacitance-type touch panel sensor to each other in this order, and the liquid crystal display apparatus, and the capacitance-type touch panel sensor and the liquid crystal display apparatus were bonded to each other.

Then, in a high-pressure constant temperature bath, the touch panel obtained as above was exposed to an environment of 40° C. and 5 atm for 20 minutes.

As the lower adhesive layer and the upper adhesive layer in the touch panel, adhesive sheets among the adhesive films G-1 to G-9 were used (see Table 2).

In each of examples and comparative examples, by varying the type of the photomask used for preparing the detection electrodes and the lead-out wiring, the diagonal length of the touch portion (sensing portion) in the capacitance-type touch panel sensor was adjusted to be a predetermined length such that the diagonal length become compatible with the size (diagonal length) of the display screen of the liquid crystal display apparatus.

(Preparation of Sample for Test for Evaluating Temperature Dependence)

The PET release film on one side of each of the adhesive films G-1 to G-9 (thickness: 100 μm to 500 μm) was peeled off, and the exposed surface was bonded onto an Al substrate with a dimension of 20 mm (length)×20 mm (width)×0.5 mm (thickness). Thereafter, the PET release film on the other side of each of the adhesive films was peeled off, and the aforementioned Al substrate was bonded onto the exposed surface. Subsequently, the resultant was subjected to defoaming treatment under pressure for 60 minutes at 40° C. and 5 atm, thereby preparing a sample for a test for evaluating temperature dependence.

Herein, by using a micrometer, the thicknesses of five sites in the sample for a test for evaluating temperature dependence were measured, and from the average thereof, the total thickness of two Al substrates was subtracted, thereby calculating the thickness of the adhesive sheet in each sample.

(Test Method for Evaluating Temperature Dependence)

By using the sample for a test for evaluating temperature dependence that was prepared as above, the impedance thereof at 1 MHz was measured by an impedance analyzer (4294A manufactured by Agilent Technologies), thereby measuring the relative dielectric constant of the adhesive sheet.

Specifically, the temperature of the sample for a test for evaluating temperature dependence was stepwise increased by 20° C. from −40° C. to 80° C., and the impedance thereof at 1 MHz was measured at each temperature by using the impedance analyzer (4294A manufactured by Agilent Technologies), thereby obtaining the capacitance C. Herein, at each temperature, the sample was left to stand for 5 minutes until the temperature thereof became constant.

Thereafter, by using the obtained capacitance C, the relative dielectric constant at each temperature was calculated by the following Equation (X).

$$\text{Relative dielectric constant} = (\text{capacitance } C \times \text{thickness } T)/(\text{area } S \times \text{dielectric constant } \varepsilon_0 \text{ of vacuum}) \quad \text{Equation (X)}$$

Herein, the thickness T represents the thickness of the adhesive sheet, the area S represents the area (20 mm (length)×20 mm (width)) of the aluminum electrode, and the dielectric constant $\varepsilon_0$ of vacuum represents a physical constant ($8.854 \times 10^{-12}$ F/m).

From the calculated relative dielectric constants, the minimum value and the maximum value were selected, and the temperature dependence (%) was calculated by an equation [(maximum value−minimum value)/minimum value×100].

Herein, a liquid nitrogen cooling stage was used for adjusting the temperature to be a low temperature, and a hot plate was used for adjusting the temperature to be a high temperature.

(Method for Evaluating Malfunctioning)

The touch panel prepared as above was temporarily left under a condition of 85° C. and 85% RH for 2 hours. Thereafter, the temperature of the touch panel, which had undergone the high-temperature and high-humidity treatment, was stepwise increased by 20° C. from −40° C. to 80° C., and at each temperature, a rate of occurrence of malfunctioning at the time of touch was measured. That is, in each of the environments of −40° C., −20° C., 0° C., 20° C., 40° C., 60° C., and 80° C., any site of the touch panel was touched 100 times, and from the number of times the touch panel did not normally react, the rate (%) of occurrence of malfunctioning of the touch panel [(number of times that the touch panel did not normally react/100)×100] was measured.

Among the measured rates of occurrence of malfunctioning at each temperature, the maximum value was calculated. When the maximum value was equal to or less than 5%, the touch panel was evaluated to be OK, and when the maximum value was greater than 5%, the touch panel was evaluated to be NG. The results are shown in Table 2.

As described above, in the method for evaluating malfunctioning, the touch panel was exposed to a high-temperature and high-humidity environment once, and then subjected to the evaluation such that it is more rigidly evaluated.

(Method for Calculating Ratio of I/O)

The definition of the I value or the O value in the organic conceptual diagram is specifically described in the aforementioned "New Edition of Organic Conceptual Diagram-Fundamental and Application" (hereinafter, also simply referred to as a series of books), and the present invention also adopted the description thereof. In the present invention, according to the method described in the series of books, the ratio of I/O of the adhesive was calculated.

More specifically, first, by using a known method (for example, $^1$HNMR analysis), the amount (mol %) of each of the repeating units contained in the polymer (adhesive) manufactured in each of the synthesis examples was calculated.

In the series of books, the I value or the O value is calculated from the sum of products of a parameter value, which is set for each atom (for example, a carbon atom, halogen, or phosphorus atom) or each group (for example, an unsaturated linking group, an aromatic group, a linking group containing a hetero atom, a cyano group, a nitro group, or the like) contained in each of the repeating units, and a proportion of each atom or each group. Therefore, from the proportion of each group contained in each of the repeating units and the amount (mol %) of each of the repeating units, the proportion of each group in whole polymer can be calculated, and by using the proportion and the parameter value described in the series of books, the I value and the O value can be calculated. Herein, the ratio of I/O is a number obtained by dividing the I value by the O value.

(Test for Evaluating Adhesiveness)

As a measurement method used in a test for evaluating adhesiveness, each of the adhesive sheets was bonded to a glass substrate, and by the method based on "10.4 Measurement of peel adhesion" in JIS Z0237, a 180° peel strength of the adhesive sheet was measured.

More specifically, the PET release film on one side of each of the aforementioned adhesive films G-1 to G-9 (a width of 25 mm×a length of 40 mm to 50 mm) was peeled off, and an adhesive surface of the adhesive sheet was caused to face the vicinity of the center of a glass plate (equal to or greater than 40 mm×equal to or greater than 60 mm). In this state, the adhesive film and the glass plate were bonded to each other at 10 kPa to 40 kPa such that the longitudinal directions thereof matched up with each other. Thereafter, the release film on the other side of each of the adhesive films was removed, and a Kapton film (a width of 25 mm×a length of equal to or greater than 150 mm) was placed on the exposed surface of the adhesive sheet, such that a longitudinal direction thereof matched up with the longitudinal direction of the adhesive sheet. In this state, the Kapton film and the adhesive sheet were bonded to each other, such that one end of the Kapton film did not come into contact with the adhesive sheet, and the entire region of the adhesive sheet was covered with the Kapton film, thereby obtaining a laminate. Subsequently, the one end of the Kapton film that did not come into contact with the adhesive sheet was set in an autograph (manufactured by Shimadzu Corporation.) such that the Kapton film was pulled (peeled) back at an angle of 180°, and the peel strength was measured.

In the following Table 2, the "rate of occurrence of malfunctioning" shows the aforementioned maximum value.

Furthermore, the temperature dependence of the adhesive sheet shows the temperature dependence of the upper adhesive layer and the lower adhesive layer constituted with the same material.

In Table 2, the "adhesion (N/mm)" shows the result of the evaluation performed according to the aforementioned test for evaluating adhesiveness.

In Table 2, the "silver" in the column of the "detection electrode" shows a case in which the detection electrode in the capacitance-type touch panel sensor is constituted with silver wiring, and "ITO" in the same column shows a case in which the detection electrode is constituted with ITO.

In Table 2, the "size" represents the size of the display screen (and the size of the input region).

TABLE 2

| | Type of adhesive film | Maximum value of relative dielectric constant of adhesive sheet at −40 to 80° C. | Temperature dependence of relative dielectric constant of adhesive sheet | Adhesion (N/mm) | Ratio of I/O | Detection electrode | Size (inch) | Rate of occurrence of malfunctioning | Evaluation of malfunctioning |
|---|---|---|---|---|---|---|---|---|---|
| Example 1 | G-1 | 2.9 | 5.50% | 0.21 | 0.22 | Silver | 5 | 2.00% | OK |
| Example 2 | G-2 | 3.2 | 1.20% | 0.66 | 0.17 | Silver | 5 | 0.50% | OK |
| Example 3 | G-3 | 3.4 | 6.70% | 0.21 | 0.28 | Silver | 5 | 4.00% | OK |
| Example 4 | G-4 | 3.2 | 1.70% | 0.22 | 0.13 | Silver | 5 | 3.50% | OK |
| Example 5 | G-5 | 3.2 | 1.30% | 0.7 | 0.18 | Silver | 5 | 0.60% | OK |
| Example 6 | G-6 | 3.1 | 4.20% | 0.22 | 0.17 | Silver | 5 | 5.00% | OK |
| Example 7 | G-1 | 2.9 | 5.60% | 0.22 | 0.22 | Silver | 4 | 1.80% | OK |
| Example 8 | G-1 | 2.9 | 5.50% | 0.22 | 0.22 | Silver | 10 | 2.50% | OK |
| Example 9 | G-1 | 2.9 | 5.70% | 0.21 | 0.22 | ITO | 5 | 2.00% | OK |
| Comparative Example 1 | G-7 | 4.2 | 49.20% | 0.57 | 0.45 | Silver | 5 | 14.00% | NG |
| Comparative Example 2 | G-8 | 4.3 | 43.20% | 0.53 | 0.35 | Silver | 5 | 13.00% | NG |
| Comparative Example 3 | G-7 | 4.2 | 48.80% | 0.57 | 0.45 | Silver | 10 | 17.50% | NG |
| Comparative Example 4 | G-7 | 4.2 | 48.80% | 0.57 | 0.45 | Silver | 4 | 10.70% | NG |
| Comparative Example 5 | G-9 | 2.9 | 7.20% | 0.04 | 0.18 | Silver | 5 | 10.10% | NG |
| Comparative Example 6 | G-7 | 4.2 | 49.50% | 0.59 | 0.45 | ITO | 5 | 19.00% | NG |

As shown in Table 2, it was confirmed that in touch panels using the adhesive sheet of the present invention, malfunctioning did not easily occur over a range of temperature from a low temperature to a high temperature.

In contrast, as shown in Comparative examples 1 to 6, when the temperature dependence of the adhesive sheet was high, or when the adhesion (peel strength) was weak, malfunctioning easily occurred.

With reference to the method described in paragraphs [0078] to [0081] of JP 2012-512267 A, the pressure-sensitive adhesives of Examples 1 to 3 (Case 1 to Case 3) and Controls 4 and 5 (Case R4 and Case R5) described in the column of Example of JP 2012-512267 A were manufactured. By using the pressure-sensitive adhesives, the aforementioned (Test method for evaluating temperature dependence), (Method for evaluating malfunctioning), (Method for calculating ratio of I/O), and (Test for evaluating adhesiveness) were performed. The results are summarized in Table 3.

Herein, in the (Method for evaluating malfunctioning), as the capacitance-type touch panel sensor, the capacitance-type touch panel sensor A manufactured as above was used.

TABLE 3

|  | Adhesion (N/mm) | Temperature dependence of relative dielectric constant | Ratio of I/O | Evaluation of malfunctioning |
|---|---|---|---|---|
| Case 1 | 0.09 | 8.60% | 0.07 | NG |
| Case 2 | 0.14 | 8.80% | 0.068 | NG |
| Case 3 | 0.15 | 8.80% | 0.059 | NG |
| Case R4 | 0.12 | 10% | 0.055 | NG |
| Case R5 | 0.58 | 44% | 0.623 | NG |

As shown in Table 3, in Case 1 to Case 3 and Case R4, the peel strength (adhesion) of the obtained pressure-sensitive adhesives was weak, and malfunctioning frequently occurred.

Furthermore, in Case R5, the temperature dependence of the obtained pressure-sensitive adhesive was high, and malfunctioning frequently occurred.

The above results showed that intended effects were not obtained in the embodiments specifically disclosed in JP 2012-512267 A.

What is claimed is:

1. An adhesive sheet,
wherein temperature dependence of a relative dielectric constant of the adhesive sheet, which is determined by a test for evaluating temperature, is equal to or less than 30%, a 180° peel strength of the adhesive sheet, which is determined by a test for evaluating adhesiveness is equal to or greater than 0.20 N/mm,
wherein the adhesive sheet is obtained by forming an adhesive composition comprising at least one (meth) acrylate monomer, at least one tackifying agent, and at least two rubber components in the form of film and polymerizing the adhesive composition with light or heat,
wherein the at least two rubber components contain a rubber component having a polymerizable group and another rubber component having no polymerizable group,
wherein a content of the at least two rubber components in the adhesive composition are 70 parts by mass to 320 parts by mass with respect to 100 parts by mass of the at least one (meth)acrylate monomer,
wherein a content of the at least one tackifying agent in the adhesive composition is 80 parts by mass to 320 parts by mass with respect to 100 parts by mass of the at least one (meth)acrylate monomer,
in the test for evaluating temperature dependence, the adhesive sheet is sandwiched between aluminum electrodes, a temperature of the adhesive sheet is increased by 20° C. from −40° C. to 80° C., a relative dielectric constant of the adhesive sheet at each temperature is calculated by measuring impedance at 1 MHz, a minimum value and a maximum value are selected from calculated relative dielectric constants, and a value (%) calculated by an equation of [(maximum value−minimum value)/minimum value×100] is determined to be the temperature dependence, and
in the test for evaluating adhesiveness, the adhesive sheet is bonded to a glass substrate, and the 180° peel strength of the adhesive sheet is determined based on JIS 0237.

2. The adhesive sheet according to claim 1,
wherein the maximum value of the relative dielectric constants calculated at temperatures increased by 20° C. from −40° C. to 80° C. is equal to or less than 3.8.

3. The adhesive sheet according to claim 2, comprising:
an adhesive in which a ratio of a value of inorganicity to a value of organicity is 0.05 to 0.3,
wherein the ratio represents the value of inorganicity/the value of organicity.

4. The adhesive sheet according to claim 1, comprising:
an adhesive in which a ratio of a value of inorganicity to a value of organicity is 0.05 to 0.3,
wherein the ratio represents the value of inorganicity/the value of organicity.

5. A laminate for a touch panel, comprising:
the adhesive sheet according to claim 1; and
a capacitive touch panel sensor.

6. The laminate for a touch panel according to claim 5, further comprising:
a protective substrate,
wherein the capacitive touch panel sensor, the adhesive sheet, and the protective substrate are laminated on each other in this order.

7. A capacitive touch panel, having at least:
a display apparatus;
the adhesive sheet according to claim 1; and
a capacitive touch panel sensor in this order.

8. The capacitive touch panel according to claim 7,
wherein a size of an input area, which can detect a contact state with an object, of the capacitive touch panel sensor is equal to or greater than 5 inches in a diagonal direction.

9. A laminate for a touch panel, comprising:
the adhesive sheet according to claim 2; and
a capacitive touch panel sensor.

10. A laminate for a touch panel, comprising:
the adhesive sheet according to claim 4; and
a capacitive touch panel sensor.

11. A capacitive touch panel, having at least:
a display apparatus;
the adhesive sheet according to claim 2; and
a capacitive touch panel sensor in this order.

12. A capacitive touch panel, having at least:
a display apparatus;
the adhesive sheet according to claim 4; and
a capacitive touch panel sensor in this order.

* * * * *